US012598733B2

(12) United States Patent
Tang

(10) Patent No.: US 12,598,733 B2
(45) Date of Patent: Apr. 7, 2026

(54) SEMICONDUCTOR STRUCTURE, METHOD FOR FORMING SAME AND LAYOUT STRUCTURE

(71) Applicant: CHANGXIN MEMORY TECHNOLOGIES, INC., Hefei City (CN)

(72) Inventor: Yi Tang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 743 days.

(21) Appl. No.: 17/936,832

(22) Filed: Sep. 29, 2022

(65) Prior Publication Data

US 2023/0014052 A1      Jan. 19, 2023

Related U.S. Application Data

(63) Continuation of application No. PCT/CN2022/105524, filed on Jul. 13, 2022.

(30) Foreign Application Priority Data

Jun. 24, 2022    (CN) ......................... 202210730501.X

(51) Int. Cl.
*H10B 12/00* (2023.01)
(52) U.S. Cl.
CPC ............. *H10B 12/30* (2023.02); *H10B 12/03* (2023.02); *H10B 12/05* (2023.02); *H10B 12/482* (2023.02); *H10B 12/488* (2023.02)
(58) Field of Classification Search
CPC ........ H10B 12/30; H10B 12/03; H10B 12/05; H10B 12/482; H10B 12/488; H10B 12/00; H01L 21/28; H10D 64/27; H10D 89/00
See application file for complete search history.

(56) References Cited

U.S. PATENT DOCUMENTS

| | | | |
|---|---|---|---|
| 11,227,864 B1 | 1/2022 | Saeedi Vahdat | |
| 2017/0053906 A1* | 2/2017 | Or-Bach | ................ H10B 43/20 |

(Continued)

FOREIGN PATENT DOCUMENTS

| | | |
|---|---|---|
| CN | 112331663 A | 2/2021 |
| CN | 113130494 A | 7/2021 |

(Continued)

OTHER PUBLICATIONS

Extended European Search Report in application No. 22940968, mailed on Aug. 19, 2024.

*Primary Examiner* — Samuel Park
(74) *Attorney, Agent, or Firm* — Syncoda LLC; Feng Ma

(57) ABSTRACT

A method for forming a semiconductor structure includes the following: a substrate is provided, the substrate including a first area and a second area arranged in sequence in a second direction and T-shaped active pillars located in the first area and the second area and arranged in an array in a first direction and a third direction, the first, second and third directions being perpendicular to one another, and the first and second directions being parallel to a surface of the substrate; T-shaped gate structures located on surfaces of the T-shaped active pillars and bit line structures extending in the third direction are formed in the first area, a plurality of T-shaped gate structures located in the first direction being interconnected; and capacitor structures extending in the second direction is formed in the second area, the bit line structures and the capacitor structures being connected to the T-shaped gate structures.

19 Claims, 41 Drawing Sheets

(56) References Cited

U.S. PATENT DOCUMENTS

| 2019/0206869 | A1* | 7/2019 | Kim ........................ | H10B 12/20 |
|---|---|---|---|---|
| 2021/0043629 | A1 | 2/2021 | Kim et al. | |
| 2021/0183861 | A1* | 6/2021 | Lee ........................ | H10B 12/03 |
| 2021/0183862 | A1* | 6/2021 | Son ........................ | H10B 12/30 |
| 2021/0257370 | A1 | 8/2021 | Son | |
| 2022/0013524 | A1* | 1/2022 | Ryu ........................ | H10D 86/80 |
| 2022/0045062 | A1 | 2/2022 | Saeedi Vahdat et al. | |
| 2022/0068859 | A1 | 3/2022 | Choi et al. | |
| 2022/0068929 | A1 | 3/2022 | Karda et al. | |
| 2022/0077151 | A1* | 3/2022 | Lee ........................ | H10B 12/482 |
| 2022/0085023 | A1* | 3/2022 | Shin ........................ | H10B 12/03 |
| 2022/0102394 | A1* | 3/2022 | Liu ........................ | H10D 86/481 |
| 2022/0130831 | A1 | 4/2022 | Lee et al. | |
| 2022/0278106 | A1* | 9/2022 | Kim ........................ | H10D 1/714 |
| 2022/0285355 | A1 | 9/2022 | Manfrini et al. | |
| 2022/0352171 | A1 | 11/2022 | Lee et al. | |
| 2022/0375941 | A1* | 11/2022 | Lee ........................ | H10B 12/30 |
| 2023/0253242 | A1* | 8/2023 | Kim ........................ | H10B 12/05 |
| | | | | 438/210 |

FOREIGN PATENT DOCUMENTS

| CN | 113284898 | A | 8/2021 |
|---|---|---|---|
| CN | 113644066 | A | 11/2021 |
| CN | 113903741 | A | 1/2022 |
| CN | 114068425 | A | 2/2022 |
| CN | 114121814 | A | 3/2022 |
| CN | 114121820 | A | 3/2022 |
| CN | 114334836 | A | 4/2022 |
| JP | 2016009788 | A | 1/2016 |

* cited by examiner

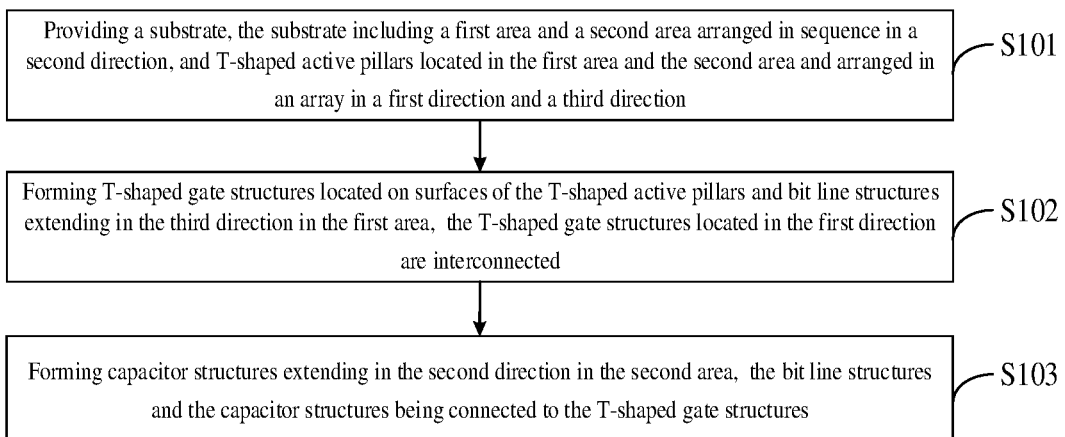

| Providing a substrate, the substrate including a first area and a second area arranged in sequence in a second direction, and T-shaped active pillars located in the first area and the second area and arranged in an array in a first direction and a third direction | S101 |

| Forming T-shaped gate structures located on surfaces of the T-shaped active pillars and bit line structures extending in the third direction in the first area, the T-shaped gate structures located in the first direction are interconnected | S102 |

| Forming capacitor structures extending in the second direction in the second area, the bit line structures and the capacitor structures being connected to the T-shaped gate structures | S103 |

FIG. 1

SEMICONDUCTOR STRUCTURE, METHOD FOR FORMING SAME AND LAYOUT STRUCTURE

CROSS-REFERENCE TO RELATED APPLICATIONS

This is a continuation of International Patent Application No. PCT/CN2022/105524 filed on Jul. 13, 2022, which claims priority to Chinese Patent Application No. 202210730501.X filed on Jun. 24, 2022. The disclosures of the above-referenced applications are hereby incorporated by reference in their entirety.

BACKGROUND

At present, dynamic random access memories (DRAMs) are mostly manufactured by using a $6F^2$ layout mode and a buried word line process. However, with this process, the miniaturization of DRAMs becomes very difficult. The performance of the DRAMs may be improved by using new materials. However, this undoubtedly increases the process complexity and the manufacturing cost of DRAMs.

On this basis, in some implementations, a DRAM with a $4F^2$ layout is manufactured by using a gate-all-around or dual-gate process, and the DRAM with a $4F^2$ layout needs to form a bit line staircase or a word line staircase. However, the bit line staircase has great sensing noise when the DRAM is operated, and the word line staircase has the problem of word line coupling and the problem that the interconnection of word lines on the same plane in the process are difficult to realize for a multi-layer stack.

SUMMARY

The disclosure relates to the technical field of semiconductors, and relates, but is not limited, to a semiconductor structure, a method for forming the same and a layout structure.

In view of this, embodiments of the disclosure provide a semiconductor structure, a method for forming the same and a layout structure.

In the first aspect, embodiments of the disclosure provide a method for forming a semiconductor structure, which includes the following operations.

A substrate is provided. The substrate includes a first area and a second area arranged in sequence in a second direction, and T-shaped active pillars located in the first area and the second area and arranged in an array in a first direction and a third direction. The first direction, the second direction and the third direction are perpendicular to one another, and the first direction and the second direction are parallel to a surface of the substrate.

T-shaped gate structures located on surfaces of the T-shaped active pillars and bit line structures extending in the third direction are formed in the first area. A plurality of the T-shaped gate structures located in the first direction are interconnected.

Capacitor structures extending in the second direction are formed in the second area. Each of the bit line structures and each of the capacitor structures are respectively connected to one corresponding T-shaped gate structure.

In the second aspect, embodiments of the disclosure provide a semiconductor structure. The semiconductor structure is formed by the above method for forming a semiconductor structure. The semiconductor structure includes: a semiconductor substrate and T-shaped active pillars located on a surface of the semiconductor substrate, the T-shaped active pillars being arranged in an array in a first direction and a third direction; a T-shaped gate structure and a bit line structure located on a surface of part of each of the T-shaped active pillars, in which a plurality of T-shaped gate structures located in the first direction are interconnected, and the bit line structure extends in the third direction; and capacitor structures extending in the second direction, in which each of the bit line structures and each of the capacitor structures are respectively connected to one corresponding T-shaped gate structure. The first direction, the second direction and the third direction are perpendicular to one another. The first direction and the second direction are parallel to the surface of the semiconductor substrate.

In the third aspect, embodiments of the disclosure provide a layout structure, which includes the above mentioned semiconductor structures arranged at intervals in the second direction.

Each of the semiconductor structures includes memory cells arranged in an array in the first direction and the third direction. Each of the memory cells includes a T-shaped gate structure and a capacitor structure.

Two adjacent ones of the memory cells in the second direction may be centrosymmetric, and projection regions of the capacitor structures of the two adjacent memory cells in the second direction at least partially overlap in the first direction.

BRIEF DESCRIPTION OF THE DRAWINGS

In the drawings (which are not necessarily drawn to scale), similar reference signs may describe similar parts in different views. Similar reference signs with different letter suffixes may represent different examples of similar parts. The drawings generally illustrate the various embodiments discussed herein by way of examples rather than limitation.

FIG. 1 illustrates a schematic flowchart of a method for forming a semiconductor structure provided by the embodiments of the disclosure.

DETAILED DESCRIPTION

Figure 2A:
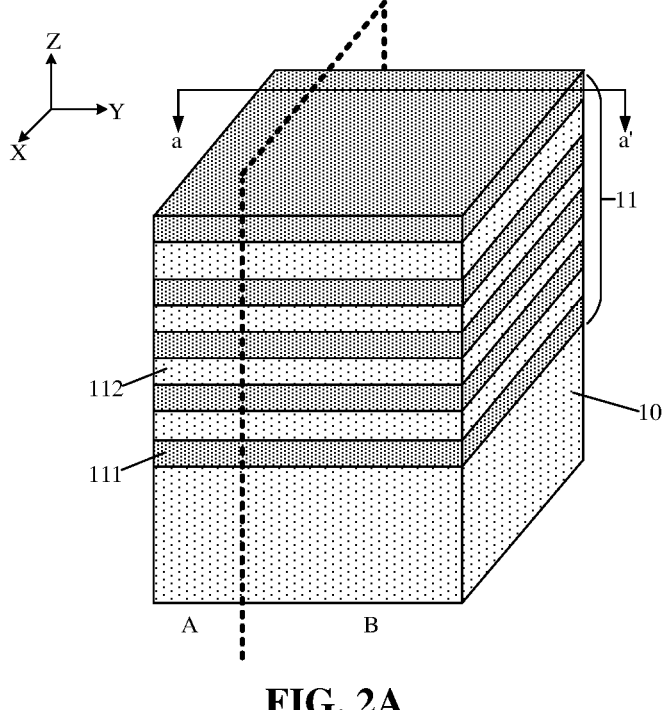
FIG. 2A illustrates a first schematic structural diagram of a process for forming the semiconductor structure provided by an embodiment of the disclosure.

Exemplary implementation modes of the disclosure will be described below in more detail with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of details are given to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the known functions and structures are not described in detail.

In the drawings, the dimensions of layers, areas, and elements and their relative dimensions may be exaggerated for clarity. Throughout, the same reference signs represent the same elements.

It is to be understood that description that an element or layer is "on", "adjacent to", "connected to", or "coupled to" another element or layer may refer to that the element or layer is directly on, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers, and/or parts may be described with terms first, second, third, etc., these elements, components, areas, layers, and/or parts should not be limited to these terms. These terms are used only to distinguish one element, component, area, layer or part from another element, component, area, layer or part. Therefore, a first element, component, area, layer, or part discussed below may be represented as a second element, component, area, layer, or part without departing from the teaching of the disclosure. However, when second element, component, area, layer, or part is discussed, it does not mean that the first element, component, area, layer, or part must exist in the disclosure.

The terms used herein are intended only to describe specific embodiments and are not a limitation of the disclosure. As used herein, singular forms "a/an", "one", and "said/the" may also be intended to include the plural forms, unless otherwise specified types in the context. It is also to be understood that, when terms "composed of" and/or "comprising/including" are used in this specification, the presence of the features, integers, steps, operations, elements, and/or components may be determined, but the presence or addition of one or more other features, integers, steps, operations, elements, components, and/or groups is also possible. As used herein, terms "and/or" includes any and all combinations of the related listed items.

Before introducing the embodiments of the disclosure, three directions for describing the three-dimensional structure that may be used in the following embodiments are defined first. Taking a Cartesian coordinate system as an example, the three directions may include an X-axis direction, a Y-axis direction, and a Z-axis direction. The substrate may include a top surface located on a front side and a bottom surface located on a back side opposite to the front side. The direction perpendicular to the top surface and the bottom surface of the substrate is defined as the third direction in a case of ignoring the flatness of the top surface and the bottom surface. In the direction of the top surface and the bottom surface (that is, the plane on which the substrate is located) of the substrate, two directions that intersect each other (e.g., perpendicular to each other) are defined. For example, a word line extending direction may be defined as the first direction, a capacitor structure extending direction may be defined as a second direction, and a plane direction of the substrate may be determined on the basis of the first direction and the second direction. Here, the first direction, the second direction, and the third direction are perpendicular to one another. In the embodiments of the disclosure, the first direction is defined as an X-axis direction, the second direction is defined as the Y-axis direction, and the third direction is defined as the Z-axis direction.

Embodiments of the disclosure provide a method for forming a semiconductor structure. FIG. 1 illustrates a schematic flowchart of a method for forming a semiconductor structure provided by the embodiments of the disclosure. As shown in FIG. 1, the method for forming the semiconductor structure includes the following operations.

At S101, a substrate is provided. The substrate includes a first area and a second area arranged in sequence in a second direction, and T-shaped active pillars located in the first area and the second area and arranged in an array in a first direction and a third direction.

In the embodiments of the disclosure, the substrate at least includes a semiconductor substrate. The semiconductor substrate may be a silicon substrate. The semiconductor substrate may also include other semiconductor elements such as germanium (Ge), or semiconductor compounds such as silicon carbide (SiC), gallium arsenide (GaAs), gallium phosphide (GaP), indium phosphide (InP), indium arsenide (InAs) or indium antimonide (InSb), or other semiconductor alloys such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP) and/or indium gallium arsenide phosphide (GaInAsP), or a combination thereof.

In the embodiments of the disclosure, the first area and the second area may respectively be used arranged to form different functional structures. For example, the first area may be arranged to form a gate structure, a bit line structure and a stair-shaped word line structure. The second area may be arranged to form a capacitor structure.

At S102, T-shaped gate structures located on surfaces of the T-shaped active pillars and bit line structures extending in the third direction are formed in the first area. A plurality of T-shaped gate structures located in the first direction are interconnected.

In the embodiments of the disclosure, some of the T-shaped gate structures are dual-gate structures, and some of the T-shaped gate structures are four-gate all around structures. The T-shaped gate structure covers a first surface and a second surface, in the third direction, of each T-shaped active pillar, a surface in the first direction of the T-shaped active pillar, and a surface in a second direction of the T-shaped active pillar.

Each of the bit line structures and each of the T-shaped gate structures are formed on the surfaces of one corresponding T-shaped active pillar, thus the bit line structure is connected to the T-shaped gate structure through the T-shaped active pillar.

In the embodiments of the disclosure, each word line may be formed on an outer side of the T-shaped gate structures subsequently, so that not only the interconnection of the word lines in the same plane of a multi-layer stacked structure can be realized, but also the dimension of the word line can be controlled, thereby reducing a coupling effect between word line stairs.

At S103, capacitor structures extending in the second direction are formed in the second area. Both the bit line structures and the capacitor structures are connected to the T-shaped gate structures.

The capacitor structure formed in the embodiments of the disclosure extends in the second direction. That is to say, the capacitor structure formed in the embodiments of the disclosure is arranged horizontally, and the horizontal capacitor structure can reduce the risk of tipping or breaking, so that the stability of the capacitor structure can be improved. In addition, a plurality of horizontal capacitor structures and T-shaped gate structures may be stacked to form a three-dimensional semiconductor structure, and the integration degree of the semiconductor structure can be improved, and the miniaturization can be realized.

FIG. 2A to FIG. 2L and FIG. 3A to FIG. 3Q illustrate schematic structural diagrams showing a process for forming a semiconductor structure provided by an embodiment of the disclosure. The process for forming the semiconductor structure provided by the embodiments of the disclosure will be further described below in detail with reference to FIG. 2A to FIG. 2L and FIG. 3A to FIG. 3Q.

Reference may be made to FIG. 2A to FIG. 2K. In S101, a substrate is provided. The substrate includes a first area and a second area arranged in sequence in a second direction, and T-shaped active pillars located in the first area and the second area and arranged in arrays in a first direction and a third direction. FIG. 2A is a three-dimensional view. FIG. 2B to FIG. 2K are top views or sectional views along a-a', b-b' and c-c' in the process for forming a semiconductor structure.

In some embodiments, the T-shaped active pillars may be formed by the following operations. A semiconductor substrate 10 is provided. A stacked structure 11 located in the first area A and the second area B is formed on a surface of the semiconductor substrate 10. Herein, the stacked structure 11 includes first semiconductor layers 111 and second semiconductor layers 112 stacked alternately in the third direction. The first semiconductor layers 111 in the first area A are removed to expose the second semiconductor layers 112 in the first area A. Thinning processing is performed on the exposed second semiconductor layers 112 to form initial active layers 110. The initial active layers 110 are processed to form the T-shaped active pillars 12.

Figure 2B:
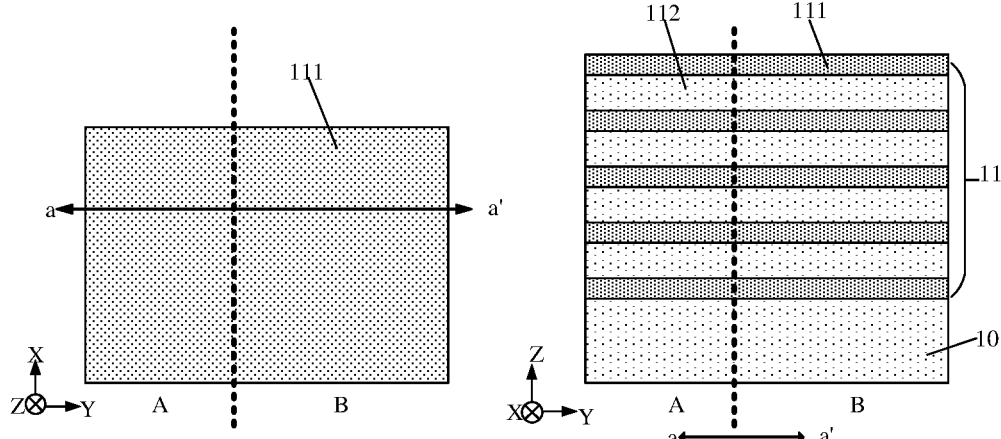
FIG. 2B illustrates a second schematic structural diagram of a process for forming the semiconductor structure provided by an embodiment of the disclosure.

As shown in FIG. 2A and FIG. 2B, a stacked structure 11 located in the first area A and the second area B is formed on the surface of the semiconductor substrate 10. The stacked structure 11 includes first semiconductor layers 111 and second semiconductor layers 112 stacked alternately in the third direction.

In the embodiments of the disclosure, the material of the first semiconductor layer 111 may be Ge, SiGe, or SiC, or may be silicon-on-insulator (SOI) or a germanium-on-insulator (GOI). The second semiconductor layer 112 may be a silicon layer, or may also include other semiconductor elements such as germanium, or include semiconductor compounds such as silicon carbide, gallium arsenide, gallium phosphide, indium phosphide, indium arsenide or indium antimonide, or include other semiconductor alloys such as silicon germanium, arsenic gallium phosphide, indium aluminum arsenide, gallium aluminum arsenide, indium gallium arsenide, indium gallium phosphide, or indium gallium arsenide phosphate, or a combination thereof.

In the embodiments of the disclosure, the material of the first semiconductor layer 111 and the material of the second semiconductor layer 112 are different since the first semiconductor layer 111 needs to be removed and the second semiconductor layer 112 needs to be remained subsequently. Therefore, the first semiconductor layer 111 has a higher etching selectivity relative to the second semiconductor layer 112. For example, the etching selective ratio of the first semiconductor layer 111 relative to the second semiconductor layer 112 may be 5-15, so that the first semiconductor layer 111 is etched and removed more easily relative to the second semiconductor layer 112 during etching.

In the embodiments of the disclosure, the thickness of the first semiconductor layer 111 may be 5 to 30 nm, such as 10 nm or 25 nm. The thickness of the second semiconductor layer 112 may be 50 to 80 nm, such as 60 nm or 75 nm. The number of the first semiconductor layers 111 and the number of the second semiconductor layers 112 in the stacked structure 11 may be set according to the required capacitor density (or storage density). The greater the numbers of the first semiconductor layers 111 and the second semiconductor layers 112, the higher the integration degree of the formed semiconductor structure and the greater the capacitor density.

In the embodiments of the disclosure, the first semiconductor layers 111 and the second semiconductor layers 112 may be formed by any one of the following deposition processes: an epitaxial process, a chemical vapor deposition (CVD) process, a physical vapor deposition (PVD) process, an atomic layer deposition (ALD) process, a spin coating process, a coating process, or a thin-film process.

Figure 2C:
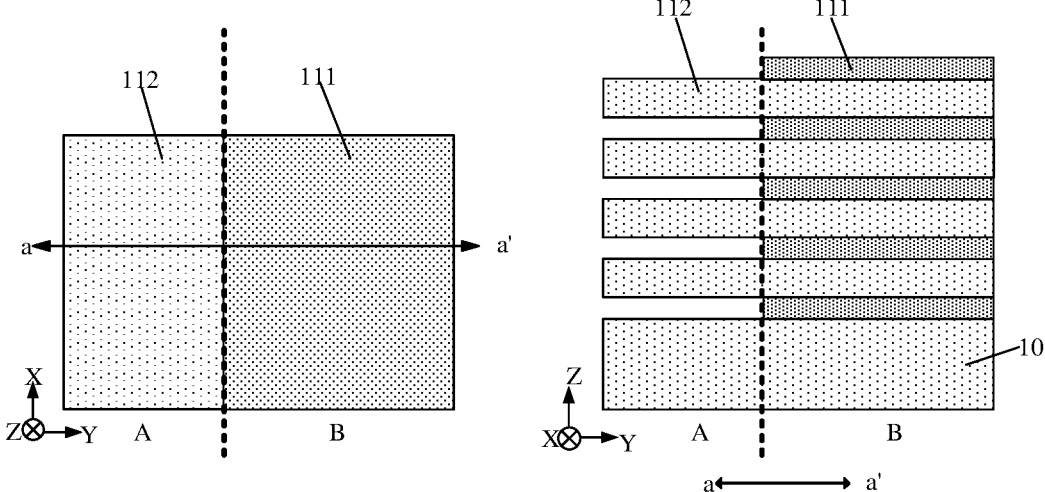
FIG. 2C illustrates a third schematic structural diagram of a process for forming the semiconductor structure provided by an embodiment of the disclosure.

As shown in FIG. 2C, the first semiconductor layers 111 in the first area A are removed, so as to expose the second semiconductor layers 112 in the first area A.

In the embodiments of the disclosure, the first semiconductor layers 111 in the stacked structure 11 may be removed by a wet etching process (for example, etching with a strong acid such as concentrated sulfuric acid, hydrofluoric acid, or concentrated nitric acid) or a dry etching process. The first semiconductor layers 111 have higher etching selectivity relative to the second semiconductor layers 112, so that the second semiconductor layers 112 are not damaged when the first semiconductor layers 111 are removed.

Figure 2D:
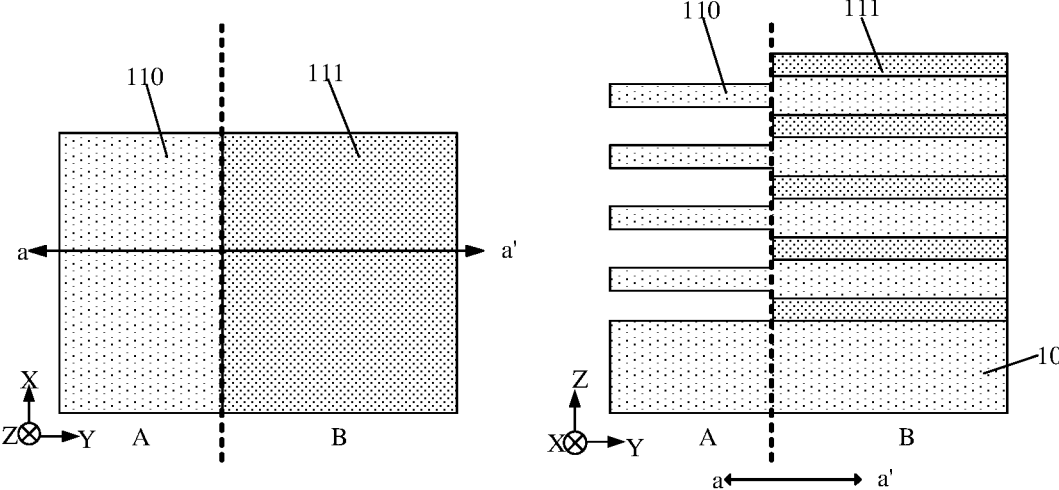
FIG. 2D illustrates a fourth schematic structural diagram of a process for forming the semiconductor structure provided by an embodiment of the disclosure.

As shown in FIG. 2D, thinning processing is performed on the exposed second semiconductor layers 112, so as to form the initial active layers 110.

In the embodiments of the disclosure, each of the second semiconductor layers 112 may be subjected to the thinning processing with the following two modes, so as to form the initial active layers 110.

Mode 1: The second semiconductor layers 112 are directly subjected to dry etching, and the etching is stopped when the required thickness is formed.

Mode 2: The second semiconductor layers 112 are oxidized in-situ to oxidize part of each second semiconductor layer 112 into a silicon oxide layer, and the silicon oxide layer is removed by the wet etching or dry etching processes.

In the embodiments of the disclosure, the second semiconductor layers 112 are thinned to 15 to 25 nm to form the initial active layers 110. For example, the thickness of each formed initial active layer 110 may be 20 nm. Thus, channel areas formed by fully depleted semiconductor layers may be formed. At this moment, holes are easily recombined in the source area without accumulation, so that a floating body effect can be improved. In addition, since the gap between two adjacent initial active layers 110 becomes large, a larger space is reserved for the formation of the gate structures and the subsequent word line structures, thereby reducing a word line coupling effect, and the preparation process complexity and the manufacturing cost of the gate structures and the word line structures.

It is to be noted that, in other embodiments, the second semiconductor layers 112 may not be subjected to the thinning processing. After the first semiconductor layers 111 in the first area A are removed, the exposed second semiconductor layers 112 may be directly used as the initial active layer 110.

In some embodiments, the operation that the initial active layers 110 are processed to form the T-shaped active pillars 12 may include the following operations. A sacrificial layer 131 and a first supporting layer 141 are formed on a surface of each initial active layer 110 in sequence. Herein the first supporting layers 141 fill between the sacrificial layers 131. Part of each first supporting layer 141, part of each sacrificial layer 131, and part of each initial active layer 110 in the first area A and part of the stacked layer structure 11 in the second area are removed, so as to form a plurality of concave grooves 15 arranged at intervals in the first direction. Part of each initial active layer in the second direction is removed to form a first space, and the remaining initial active layer forms the T-shaped active pillar.

Figure 2E:
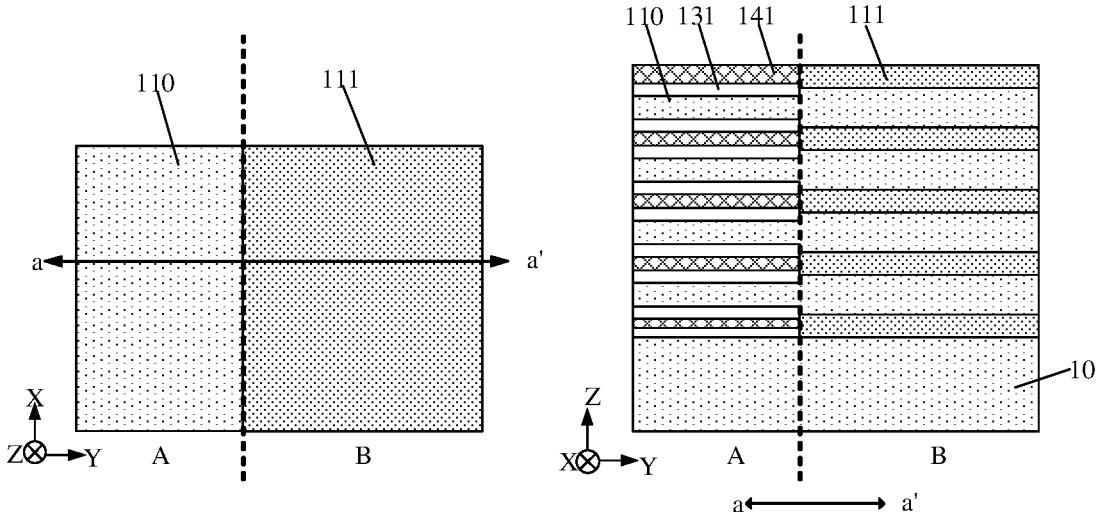
FIG. 2E illustrates a fifth schematic structural diagram of a process for forming the semiconductor structure provided by an embodiment of the disclosure.
Figure 2F:
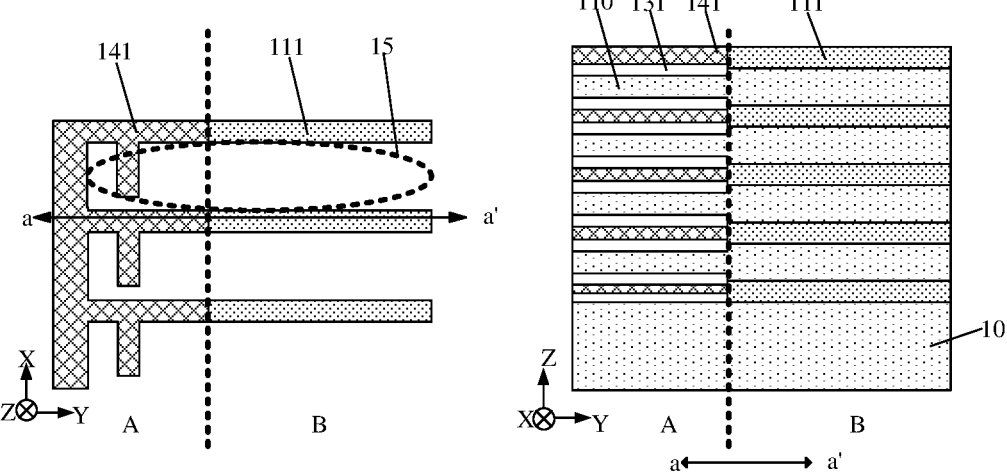
FIG. 2F illustrates a sixth schematic structural diagram of a process for forming the semiconductor structure provided by an embodiment of the disclosure.

As shown in FIG. 2E and FIG. 2F, a first sacrificial layer 131 and a first supporting layer 141 are formed in a sequence on each of the initial active layers 110. Part of the first supporting layer 141, part of the first sacrificial layer 131, and part of the initial active layer 110 in the first area A, and part of the stacked structure from second area 11 are removed, so as to form a plurality of concave grooves 15 arranged at intervals in the X-axis direction.

In the embodiments of the disclosure, the material of the sacrificial layers 131 may be silicon oxide or other suitable materials. The material of the first supporting layers 141 may be silicon oxide or other suitable materials. Here, the material of the first sacrificial layer 131 and the material of the first supporting layer 141 should be different, and have different etching selectivity under the same etching conditions. For example, the etching selective ratio of the first sacrificial layer 131 to the semiconductor substrate 10 is greater than the etching selective ratio of the first supporting layer 141 to the semiconductor substrate 10. The first sacrificial layer 131 and the first supporting layer 141 may be formed by any suitable deposition process, for example, a chemical vapor deposition process, a physical vapor deposition process, an atomic layer deposition process, a spin coating process, a coating process or a furnace tube process.

In the embodiments of the disclosure, the first supporting layers 141 are formed to support the second semiconductor layers 112. Since the T-shaped gate structure needs to be formed on the surface of each second semiconductor layer 112 subsequently, the first supporting layers 141 can also be used to support the T-shaped gate structures. Thus, the stability of the formed semiconductor structure can be improved and the collapse of the formed semiconductor structure can be prevented.

In the embodiments of the disclosure, part of each first supporting layer 141, part of each first sacrificial layer 131, and part of each initial active layer 110 in the first area A, and part of the stacked structure 11 in the second area B may be removed by a dry etching technology, so as to form a plurality of concave grooves 15 arranged at intervals in first direction.

In the embodiments of the disclosure, each T-shaped active pillar will form a memory cell. Two adjacent memory cells in the X-axis direction are isolated by one concave groove 15.

Figure 2G:
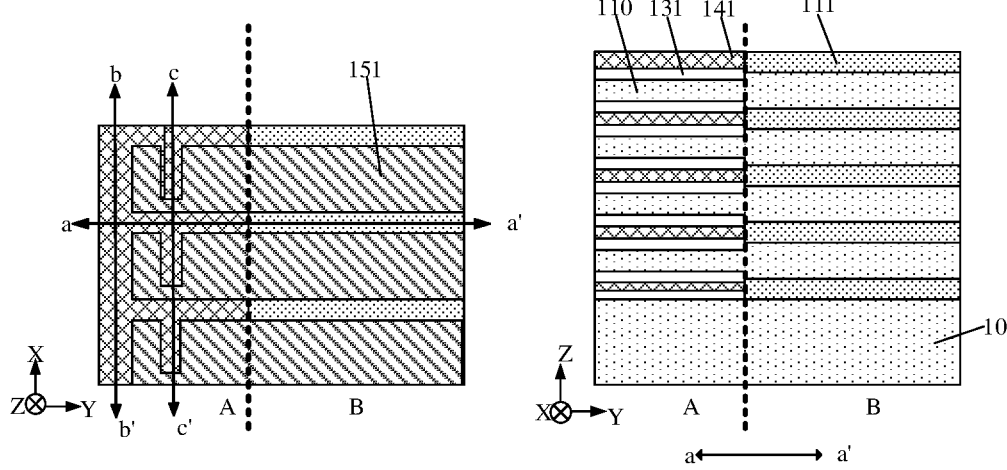
FIG. 2G illustrates a seventh schematic structural diagram of a process for forming the semiconductor structure provided by an embodiment of the disclosure.
Figure 2H:
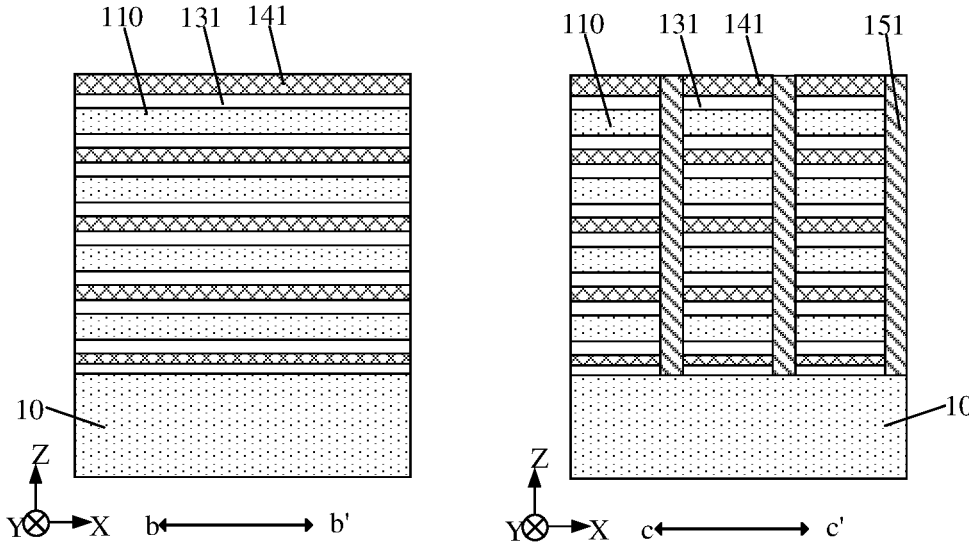
FIG. 2H illustrates an eighth schematic structural diagram of a process for forming the semiconductor structure provided by an embodiment of the disclosure.

In some embodiments, as shown in FIG. 2G and FIG. 2H, after forming the concave grooves 15, the method for forming a semiconductor structure further includes an operation that an isolating material is filled in each concave groove 15, so as to form an isolating layer 151. The isolating material may be a low-dielectric constant (Low K) material, such as SiCON.

In the embodiments of the disclosure, the etching selective ratio of the isolation layer 151 to the semiconductor substrate 10 is greater than the etching selective ratio of the first sacrificial layer 131 to the semiconductor substrate 10. That is, the isolating layer 151 is etched and removed more easily than the first sacrificial layer 131 under the same etching condition.

In the embodiments of the disclosure, the Low K material is used as the isolating material, which can reduce the parasitic capacitance of the semiconductor structure, so as to reduce the capacitance resistance delay and improve the response time of the semiconductor structure.

Figure 2I:
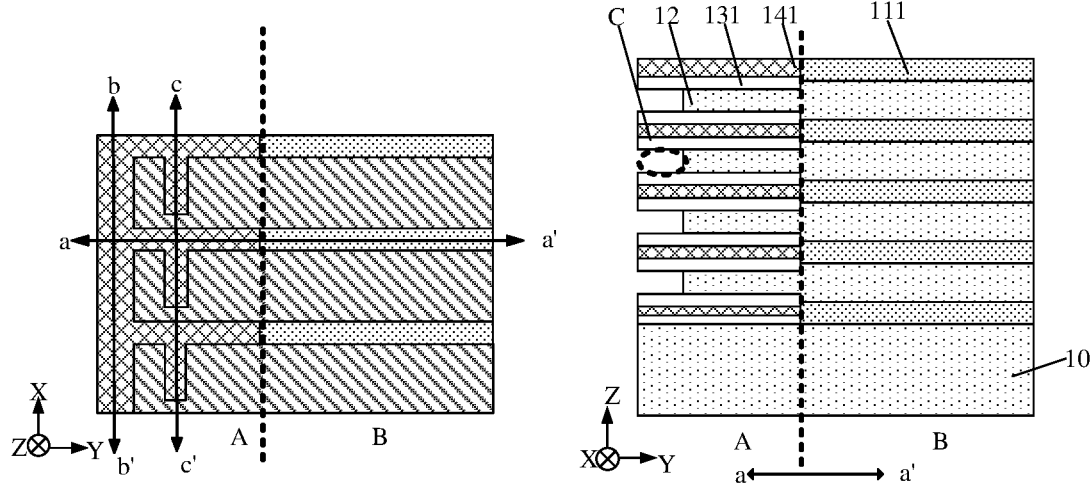
FIG. 2I illustrates a ninth schematic structural diagram of a process for forming the semiconductor structure provided by an embodiment of the disclosure.
Figure 2J:
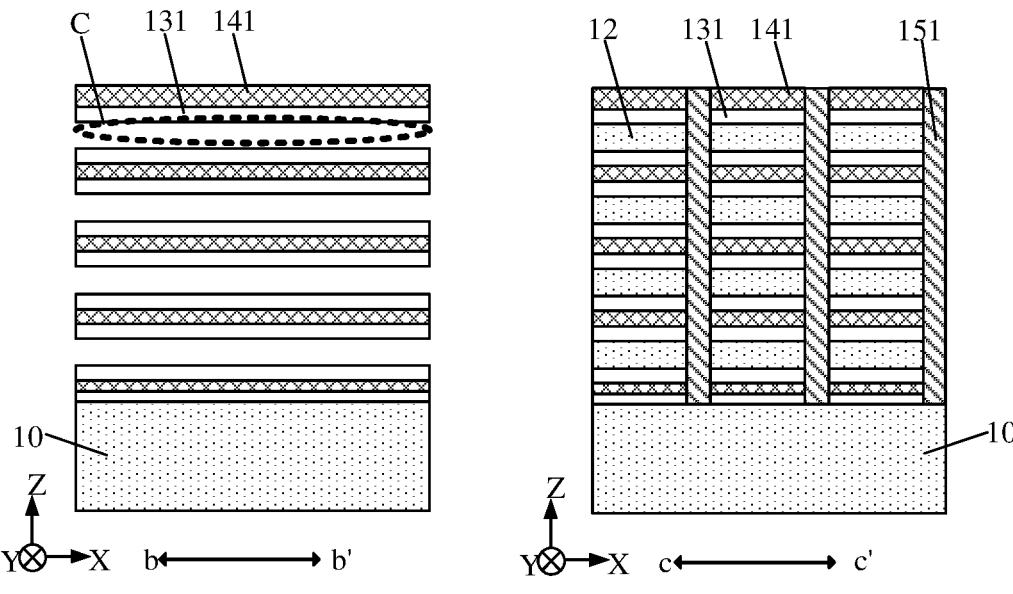
FIG. 2J illustrates a tenth schematic structural diagram of a process for forming the semiconductor structure provided by an embodiment of the disclosure.

As shown in FIG. 2I and FIG. 2J, part of each initial active layer 110 along the Y-axis direction is removed to form a first space C, and the remaining initial active layer 110 forms the T-shaped active pillar 12.

In the embodiments of the disclosure, part of the initial active layer 110 is laterally etched by using a wet etching process, so as to form a T-shaped active pillar 12. An etching solution for the wet etching may be hydrofluoric acid solution, or may be a mixed solution of diluted hydrofluoric acid and aqueous ammonia.

In some embodiments, each T-shaped active pillar located in the first area A includes a first active pillar and a second active pillar extending in the second direction, as well as a third active pillar and a fourth active pillar extending in the first direction. The first active pillar is connected with the third active pillar.

Figure 2K:
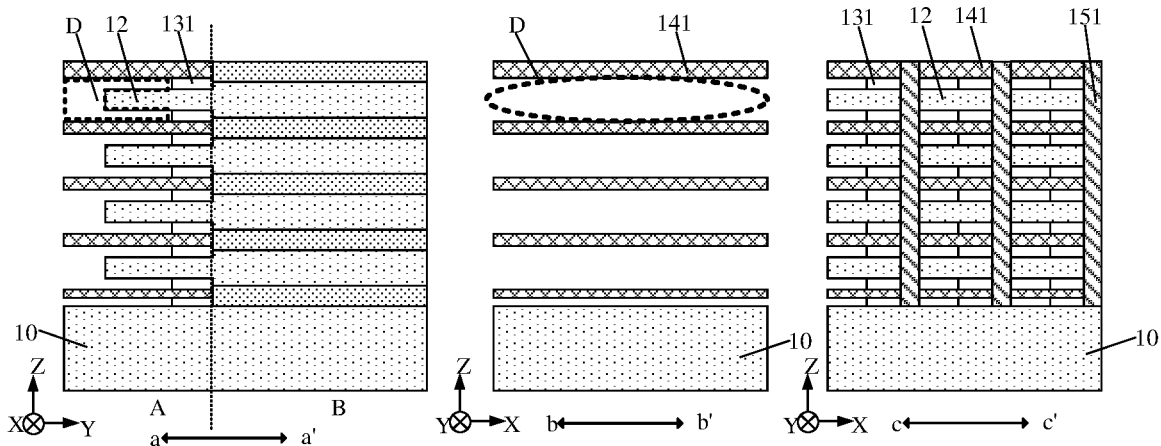
FIG. 2K illustrates an eleventh schematic structural diagram of a process for forming the semiconductor structure provided by an embodiment of the disclosure.
Figure 2L:
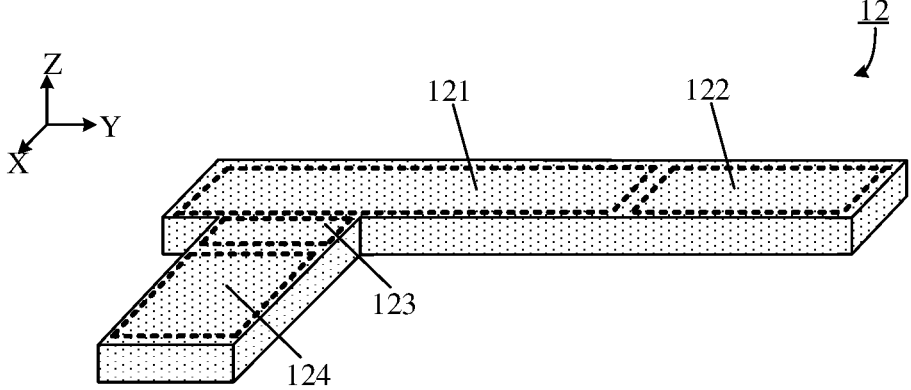
FIG. 2L illustrates a twelfth schematic structural diagram of a process for forming the semiconductor structure provided by an embodiment of the disclosure.

FIG. 2L is a schematic diagram of a three-dimensional structure of one T-shaped active pillar 12 in the first area A. As shown in FIG. 2K and FIG. 2L, the first active pillar 121, the second active pillar 122, the third active pillar 123 and the fourth active pillar 124 may be formed by the following operations. Part of each first sacrificial layer 131 is removed along the X-axis direction and the Y-axis direction to expose part of each initial active layer 110 and form a second space D. Herein, the parts extending in the X-axis direction and the Y-axis direction of the exposed part of each initial active layer 110 respectively constitute the first active pillar 121 and the third active pillar 123 (as shown in FIG. 2L). The parts extending in the first direction and in the second direction of the un-exposed part of each initial active layer 110 respectively constitute the second active pillar 122 and the fourth active pillar 124 (as shown in FIG. 2L). The second space D includes the first space C.

In the embodiments of the disclosure, since the T-shaped gate structure and the word line structure will be formed in the second space D subsequently, the interconnection of word lines on the same plane of a multi-layer stacked structure can be realized through side-connected word lines.

Figure 3A:
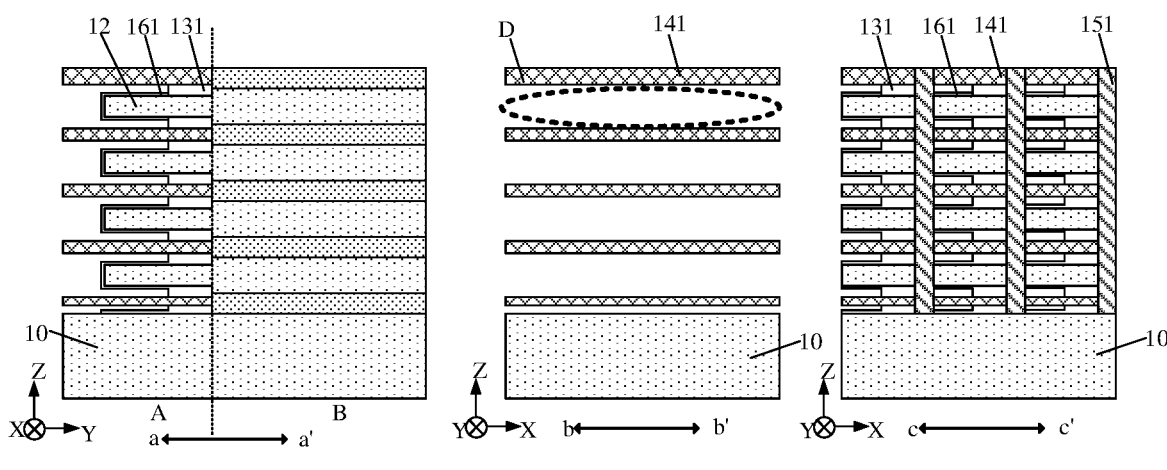
FIG. 3A illustrates a first schematic structural diagram of a process for forming the semiconductor structure provided by another embodiment of the disclosure.
Figure 3B:
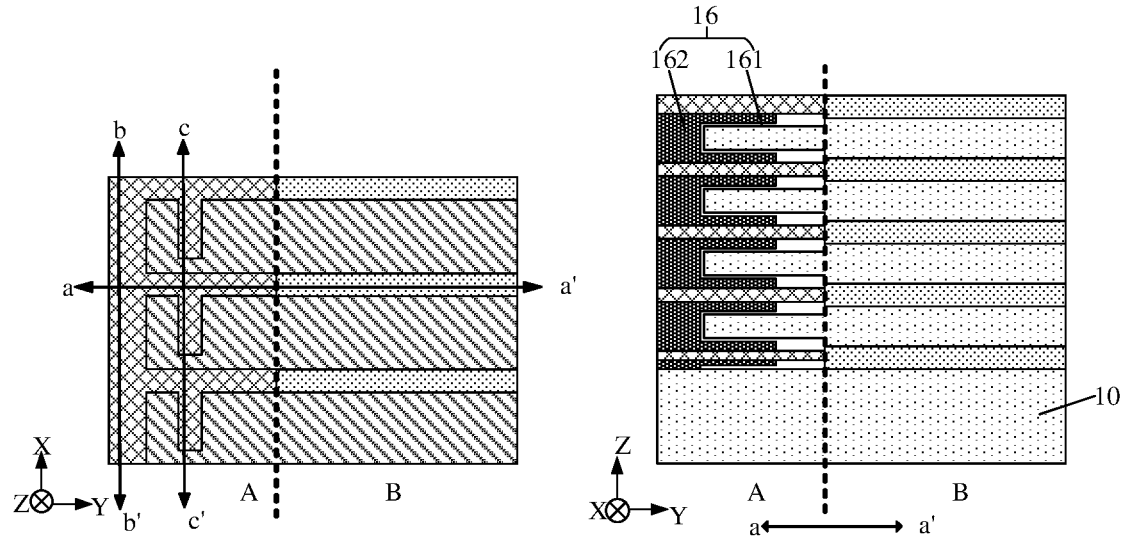
FIG. 3B illustrates a second schematic structural diagram of a process for forming the semiconductor structure provided by another embodiment of the disclosure.
Figure 3C:
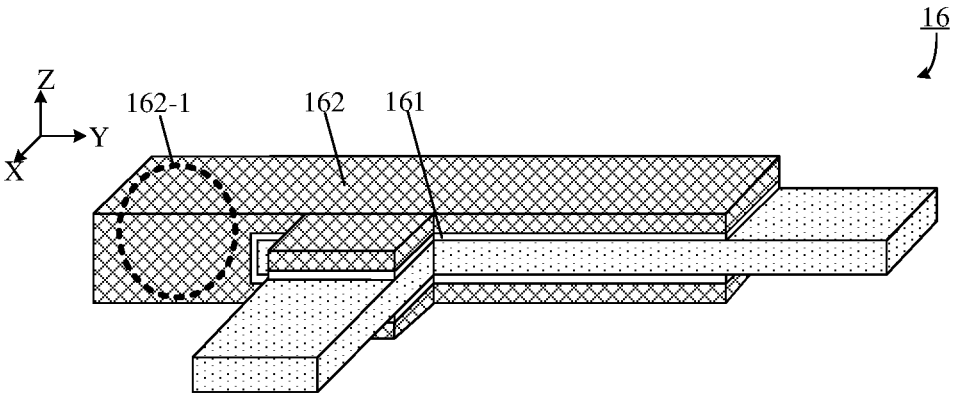
FIG. 3C illustrates a third schematic structural diagram of a process for forming the semiconductor structure provided by another embodiment of the disclosure.
Figure 3D:
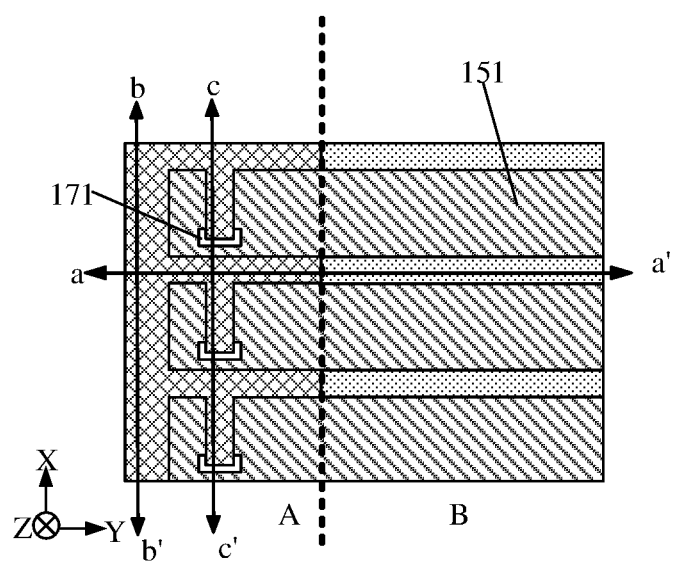
FIG. 3D illustrates a fourth schematic structural diagram of a process for forming the semiconductor structure provided by another embodiment of the disclosure.
Figure 3E:
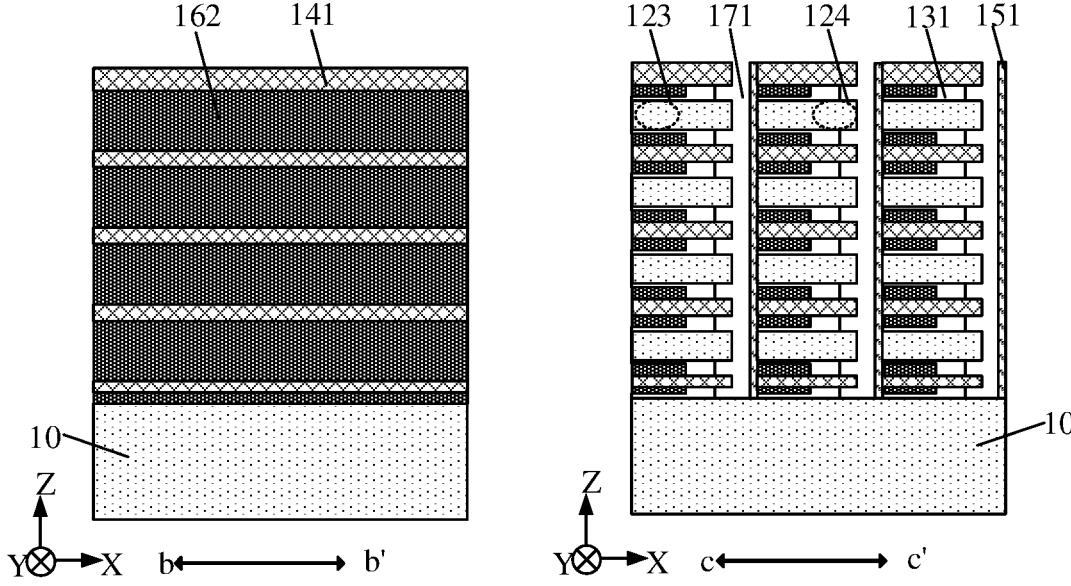
FIG. 3E illustrates a fifth schematic structural diagram of a process for forming the semiconductor structure provided by another embodiment of the disclosure.
Figure 3F:
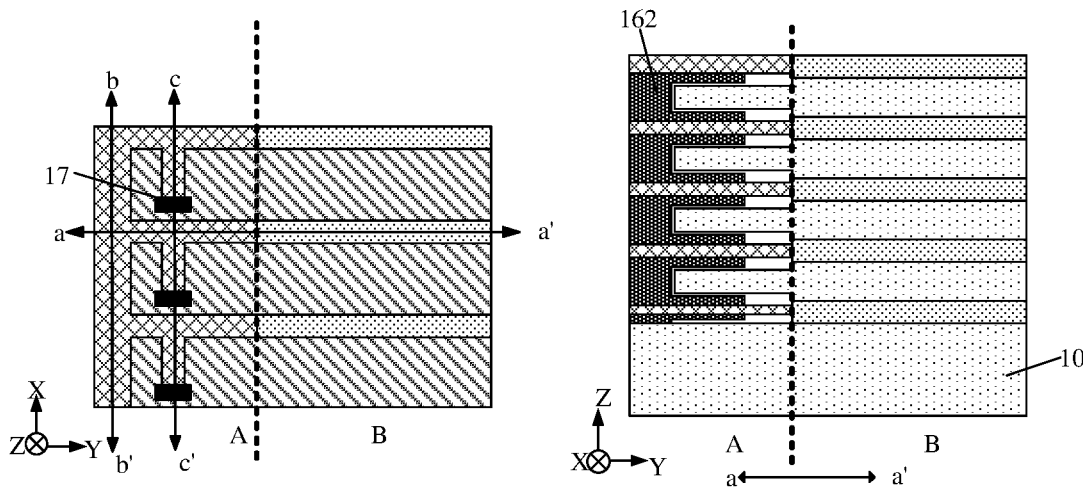
FIG. 3F illustrates a sixth schematic structural diagram of a process for forming the semiconductor structure provided by another embodiment of the disclosure.
Figure 3G:
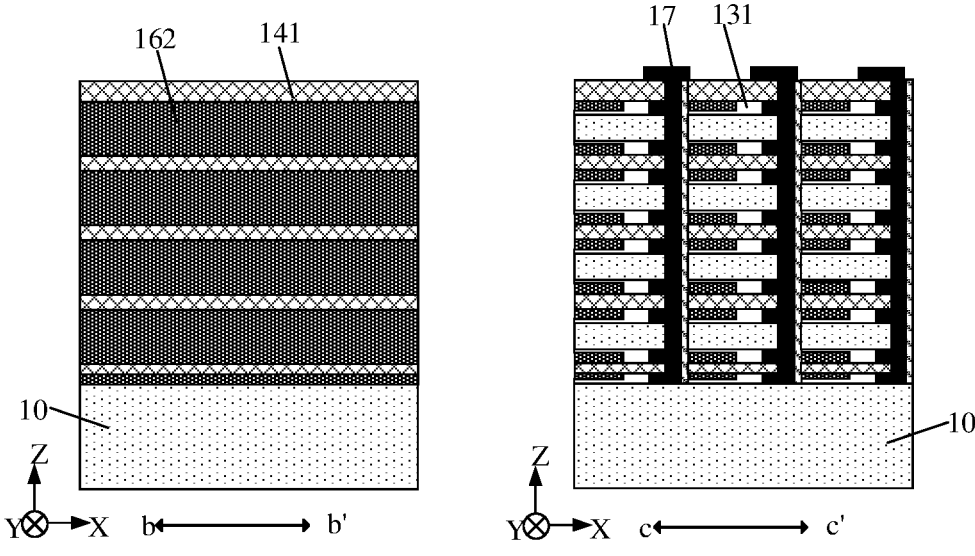
FIG. 3G illustrates a seventh schematic structural diagram of a process for forming the semiconductor structure provided by another embodiment of the disclosure.

Then, in S102, with reference to FIG. 3A to FIG. 3H, T-shaped gate structures located on surfaces of the T-shaped active pillars and bit line structures extending in the third direction are formed in the first area A. A plurality of T-shaped gate structures located in the first direction are interconnected. FIG. 3A and FIG. 3B, and FIG. 3D to FIG. 3H are top views or sectional views showing the process for forming a semiconductor structure in a-a', b-b' and c-c', and FIG. 3C is a three-dimensional view of one T-shaped gate structure 16.

As shown in FIG. 3A to FIG. 3C, the T-shaped gate structure 16 may be formed by the following operations. A gate dielectric layer 161 and a gate conductive layer 162 are formed on surfaces of the first active pillar 121 and the third active pillar 123, so as to form the T-shaped gate structure 16. The gate conductive layer 162 fills the second space D.

In the embodiments of the disclosure, the material of the gate dielectric layer 161 may be silicon oxide or other suitable materials. The material of the gate conductive layer 162 may include one of polysilicon, a metal (e.g., tungsten, copper, aluminum, titanium, tantalum, ruthenium, etc.), a metal alloy, a metal silicide, a titanium nitride, or any combination thereof.

In the embodiments of the disclosure, the gate dielectric layer 161 may be formed by an in-situ steam generation (ISSG) process. The thickness of the gate dielectric layer 161 may be 45 to 80 nm, such as 50 nm or 70 nm. The gate conductive layer 162 may be formed by any suitable deposition process, such as the CVD process, the PVD process or the ALD process.

Continuing to refer to FIG. 3C, in the embodiments of the disclosure, in the Y-axis direction, a part of the gate metal layer 162-1 located at a first end of the T-shaped gate structure 16 may be used as part of a word line structure that connects to T-shaped gate structures of the same layer subsequently.

In some embodiments, as shown in FIG. 3D to FIG. 3G, the bit line structure 17 may be formed by the following operations. Part of the first sacrificial layer 131 and part of the isolating layer 151 on sidewall of each fourth active pillar 124 are removed to form a bit line groove 171. The bit line groove 171 exposes one end, far away from the third active pillar 123, of the fourth active pillar 124, and part of the isolating layer 151 is retained between two adjacent ones of the T-shaped active pillars 12 in the X-axis direction. A bit line metal material fills in the bit line grooves 171 to form bit line structures 17 extending in the Z-axis direction.

In the embodiments of the disclosure, the bit line metal material may be any material with a good electrical conductivity, such as tungsten, cobalt, copper, aluminum, titanium, titanium nitride, platinum, palladium, molybdenum, a titanium-containing metal layer, polysilicon or any combination thereof.

In the embodiments of the disclosure, the bit line metal material is in direct contact with the second semiconductor layer 112. Subsequently, the metal material may directly react with the second semiconductor layer 112 in-situ to form a metal silicide through a rapid thermal annealing process. Since the metal silicide has a low resistance value, the contact resistance between the bit line structure and the fourth active pillar can be reduced, thereby further reducing the power consumption of the semiconductor structure.

Figure 3H:
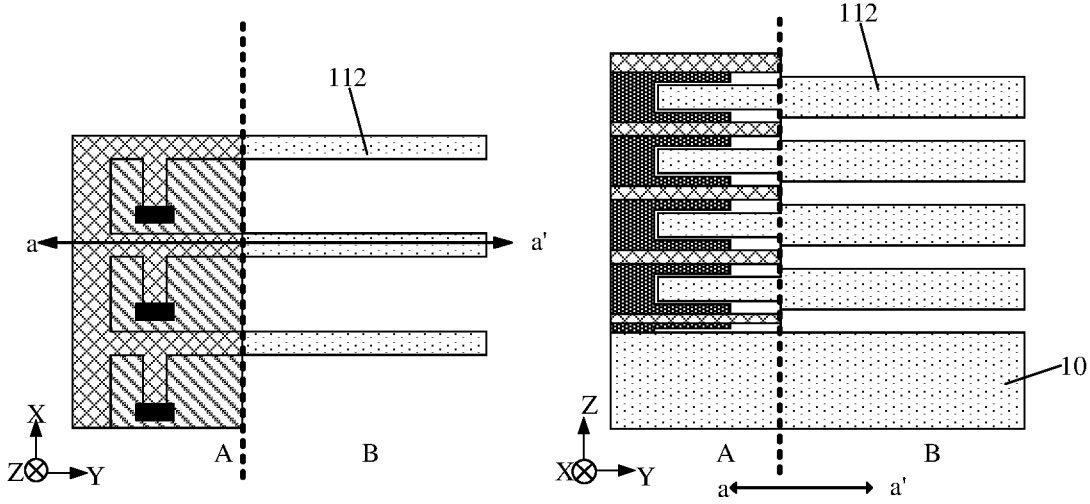
FIG. 3H illustrates an eighth schematic structural diagram of a process for forming the semiconductor structure provided by another embodiment of the disclosure.
Figure 3I:
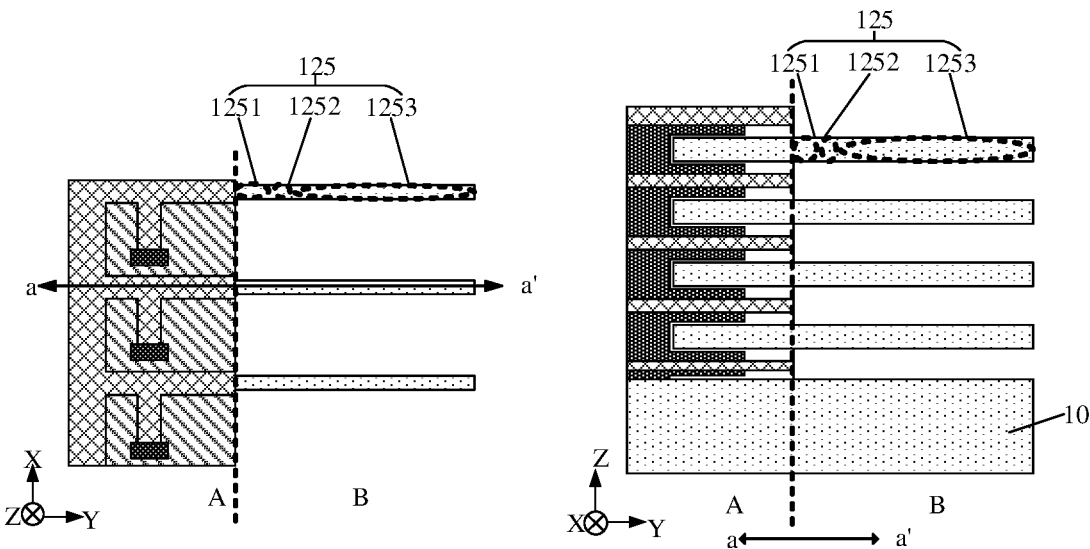
FIG. 3I illustrates a ninth schematic structural diagram of a process for forming the semiconductor structure provided by another embodiment of the disclosure.

As shown in FIG. 3H and FIG. 3I, after forming the bit line structures 17 and before forming the capacitor structures, the method for forming the semiconductor structure further includes the following operations. The isolating layers 151 and the first semiconductor layers 111 located in the second area B are removed to expose the second semiconductor layers 112 in the second area B. Thinning processing is performed on the second semiconductor layers 112 in the second area B to form fifth active pillars 125. Each fifth active pillar 125 is connected to one corresponding second active pillar 122.

Continuing to refer to FIG. 3I, in the embodiments of the disclosure, each fifth active pillar 125 includes a first sub-pillar 1251, a second sub-pillar 1252, and a third sub-pillar 1253 arranged in sequence in the Y-axis direction.

In the embodiments of the disclosure, the isolating layer 151 may be removed by a dry etching process (e.g., a plasma etching process, a reactive ion etching process, or an ion milling process) or a wet etching process (e.g., etching by using a strong acid such as concentrated sulfuric acid, hydrofluoric acid, or concentrated nitric acid). The gas used for the dry etching may be one of trifluoromethane ($CHF_3$), carbon tetrafluoride ($CF_4$), difluoromethane ($CH_2F_2$), hydrobromic acid (HBr), chlorine ($Cl_2$) or sulfur hexafluoride ($SF_6$), or a combination thereof. In the embodiments of the disclosure, the first semiconductor layers 111 have higher etching selectivity relative to the second semiconductor layers 112, so that the second semiconductor layers 112 may not be damaged when the first semiconductor layers 111 are removed.

In the embodiments of the disclosure, there are two modes of performing thinning processing on the second semiconductor layer 112 in the second area B as follows.

Mode 1: The second semiconductor layer 112 is directly subjected to dry etching, and the etching is stopped when the required thickness is formed.

Mode 2: The second semiconductor layers 112 are oxidized in-situ to oxidize part of each second semiconductor layer 112 into a silicon oxide layer, and the silicon oxide layer is removed by a wet etching or dry etching technologies.

In the embodiments of the disclosure, the gap between two adjacent fifth active pillars 125 becomes large by performing the thinning processing on the second semiconductor structures 122 to form the fifth active pillars 125. Thus, the effective area between the electrodes of the formed capacitor structures can be improved, so as to improve the capacitance of the formed capacitor structure.

It is to be noted that, in other embodiments, the second semiconductor layers 112 may also not be subjected to the thinning processing.

Figure 3J:
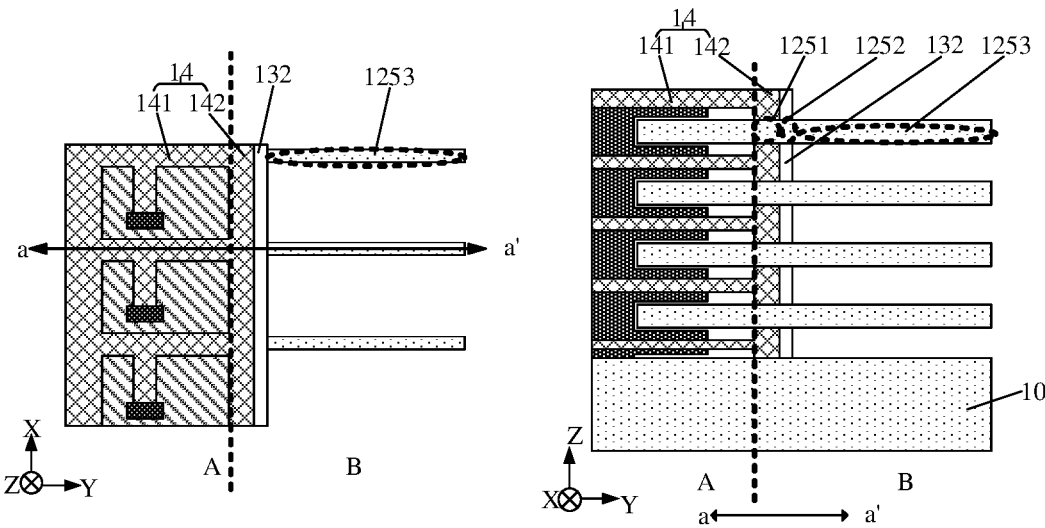
FIG. 3J illustrates a tenth schematic structural diagram of a process for forming the semiconductor structure provided by another embodiment of the disclosure.
Figure 3K:
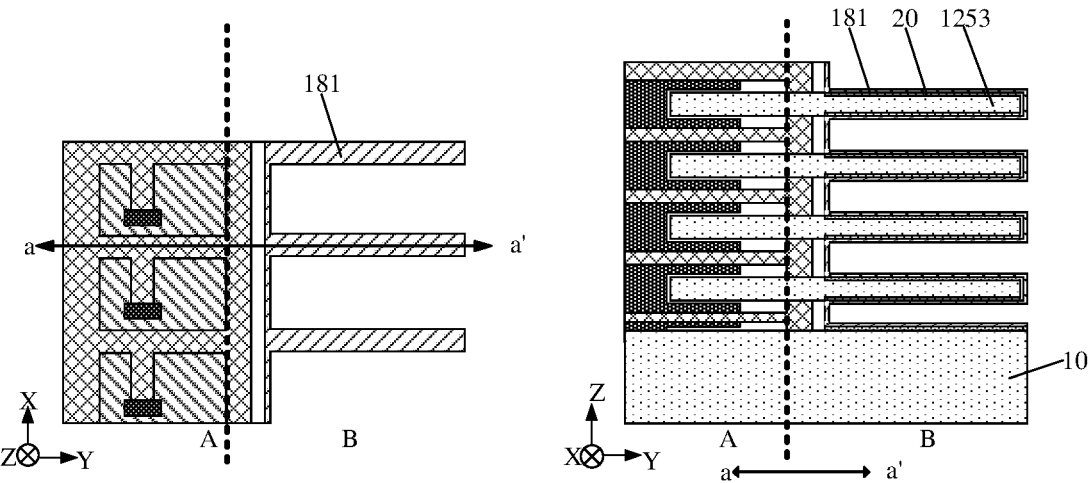
FIG. 3K illustrates an eleventh schematic structural diagram of a process for forming the semiconductor structure provided by another embodiment of the disclosure.
Figure 3L:
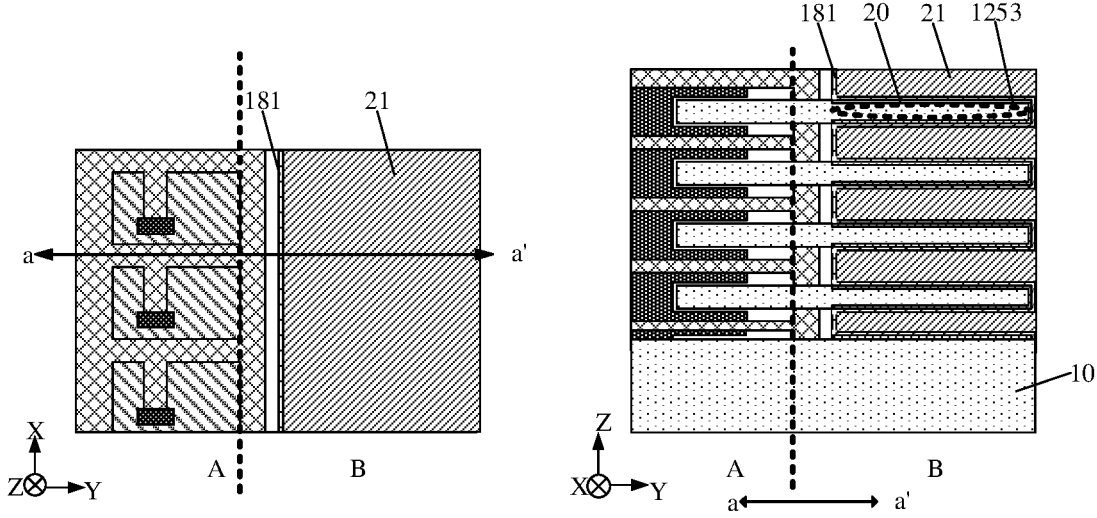
FIG. 3L illustrates a twelfth schematic structural diagram of a process for forming the semiconductor structure provided by another embodiment of the disclosure.
Figure 3M:
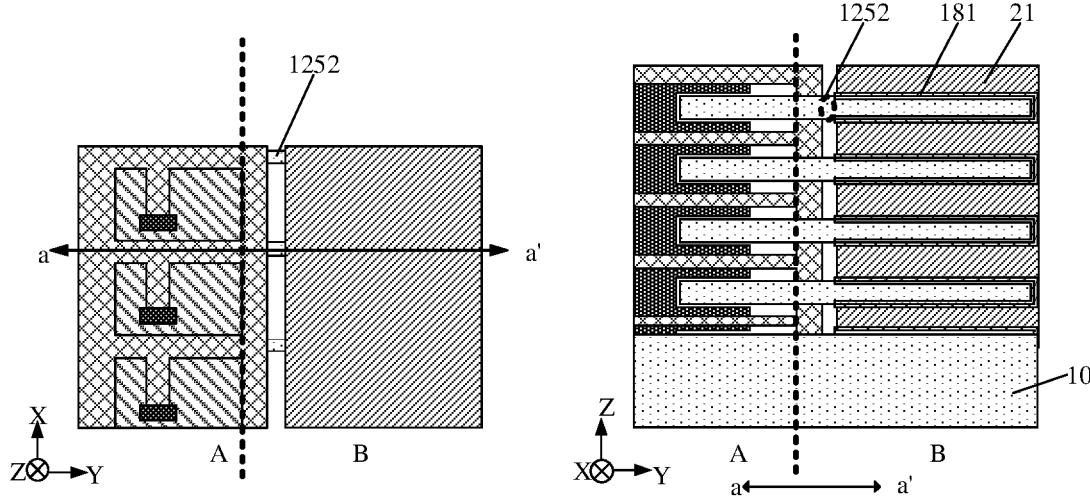
FIG. 3M illustrates a thirteenth schematic structural diagram of a process for forming the semiconductor structure provided by another embodiment of the disclosure.
Figure 3N:
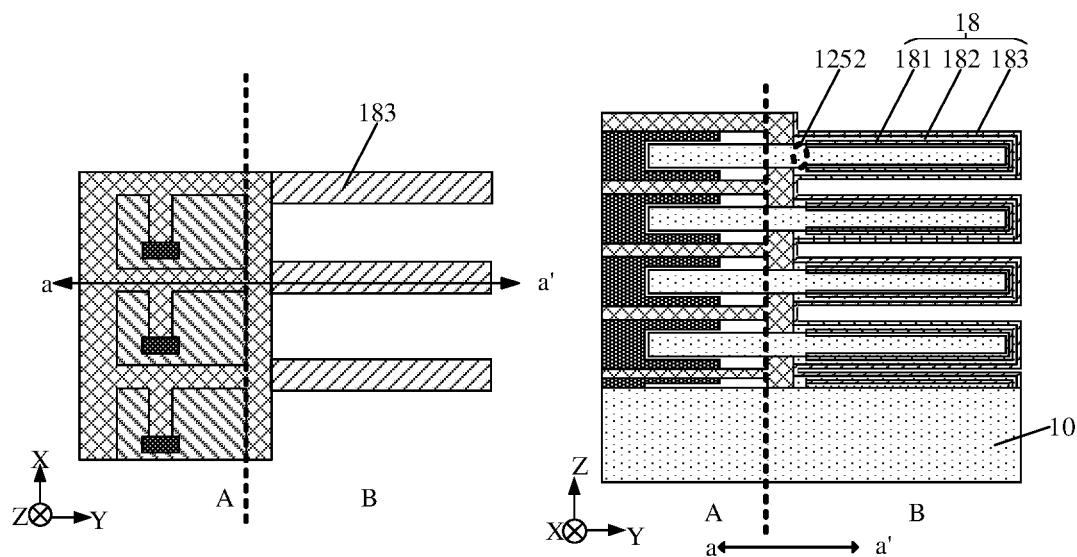
FIG. 3N illustrates a fourteenth schematic structural diagram of a process for forming the semiconductor structure provided by another embodiment of the disclosure.
Figure 3O:
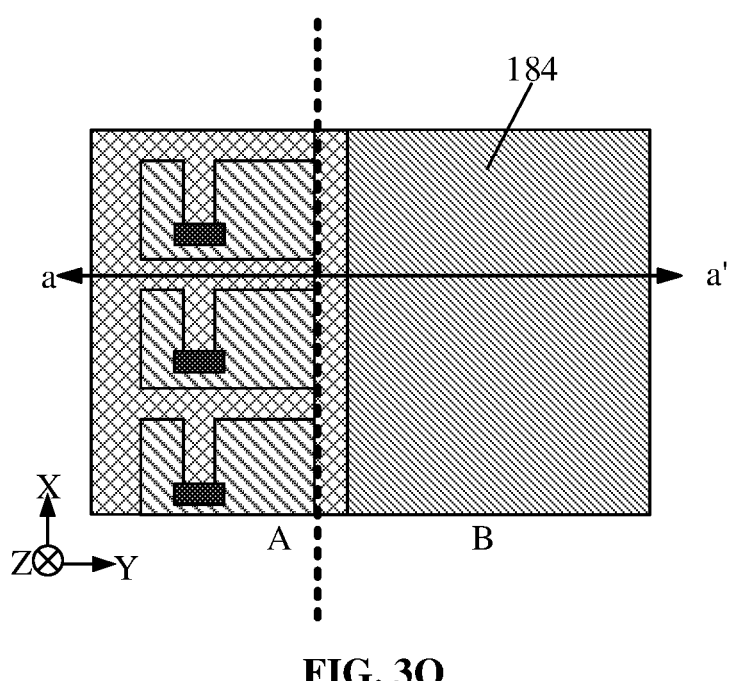
FIG. 3O illustrates a fifteenth schematic structural diagram of a process for forming the semiconductor structure provided by another embodiment of the disclosure.
Figure 3P:
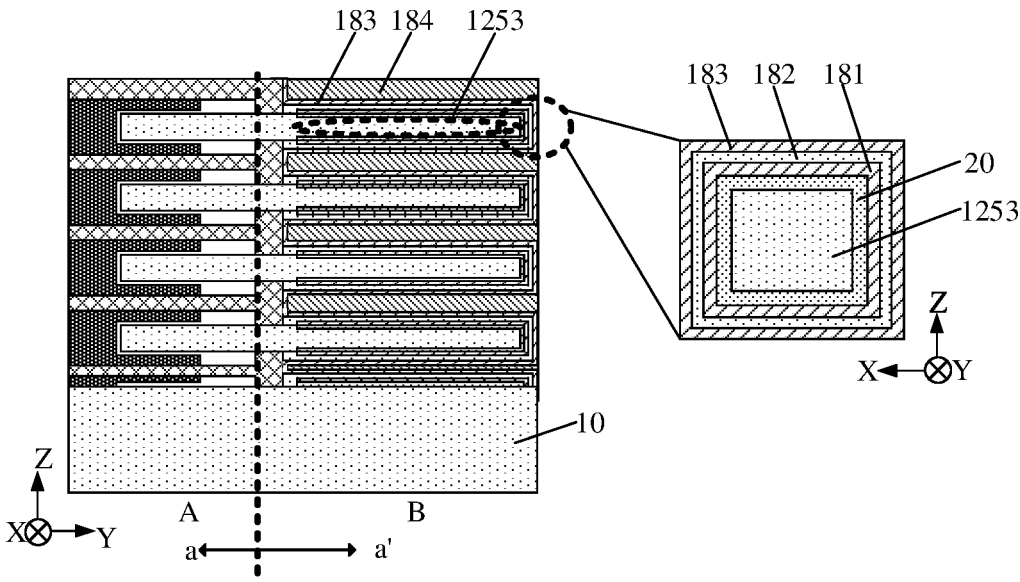
FIG. 3P illustrates a sixteenth schematic structural diagram of a process for forming the semiconductor structure provided by another embodiment of the disclosure.
Figure 3Q:
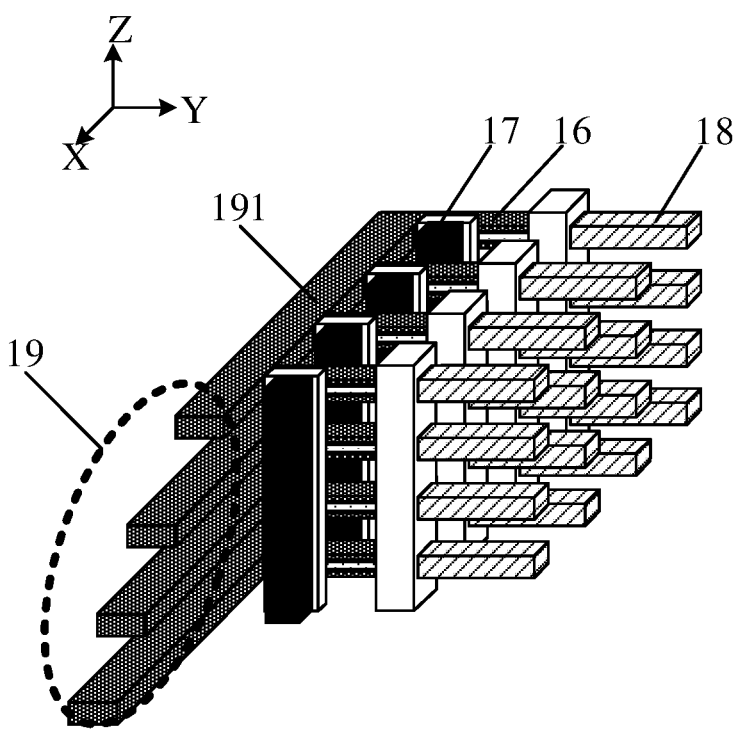
FIG. 3Q illustrates a seventeenth schematic structural diagram of a process for forming the semiconductor structure provided by another embodiment of the disclosure.

Finally, reference may be made to FIG. 3J to FIG. 3Q to perform S103. Capacitor structures extending in the second direction in the second area are formed. The bit line structures and the capacitor structures are connected to the T-shaped gate structures. FIG. 3I to FIG. 3P are top views or sectional views showing a process for forming the semiconductor structure in a-a', b-b' and c-c', and FIG. 3Q is a three-dimensional view of the formed T-shaped gate structure.

As shown in FIG. 3J, each capacitor structure 18 may be formed by the following operations. A second supporting layer 142 is formed on a surface of the first sub-pillar 1251; and a second sacrificial layer 132 is formed on a surface of the second sub-pillar 1252.

In the embodiment of the disclosure, the second supporting layer 142 fills between the first sub-pillars 1251. The material of the second supporting layer 142 may be silicon nitride or silicon carbonitride. The first supporting layer 141 and the second supporting layer 142 jointly form a supporting structure 14 of the semiconductor structure.

In the embodiments of the disclosure, the second sacrificial layer 132 fills between the second sub-pillars 1252. The material of the second sacrificial layer 132 may be silicon nitride or silicon carbonitride.

As shown in FIG. 3K and FIG. 3L, a third semiconductor layer 20 is formed on a surface of each third sub-pillar 1253. A first electrode layer 181 is formed on surfaces of the third semiconductor layers 20 and a sidewall of the second sacrificial layer 132. A protective layer 21 is formed on the surface of the first electrode layer 181 and fills up the gaps formed between the first electrode layer 181.

In the embodiments of the disclosure, the third semiconductor layer 20 may be a metal silicide layer. During implementation, a layer of metal material, such as anyone of cobalt (Co), titanium (Ti), tantalum (Ta), nickel (Ni), tungsten (W), platinum (Pt) and palladium (Pd), may be deposited on each second sub-pillar 1253. After that, the metal material interacts with the third sub-pillar 1253 through rapid thermal annealing, so that metal silicide is formed on the surface of the second sub-pillar 1253. The metal silicide has low resistance, so the contact resistance between a lower electrode and a drain can be reduced, thereby reducing the power consumption of the semiconductor structure.

In the embodiments of the disclosure, the first electrode layer 181 may be formed by any one of the following deposition processes: a selective atomic layer deposition process, a CVD process, a PVD process and a spin coating process. The material of the first electrode layer 181 may include metal or metal nitride, such as ruthenium (Ru) or titanium nitride.

In some embodiments, the material of the protective layer 21 may be silicon nitride or any other suitable material. The protective layer 21 is for protection of the first electrode layer 181 from being damaged when the second sacrificial layer 132 is subsequently removed. Therefore, the etching selective ratio of the second sacrificial layer 132 to the second sub-pillar 1252 needs to be set to be greater than the etching selective ratio of the protective layer 21 to the second sub-pillar 1252.

As shown in FIG. 3M and FIG. 3N, the second sacrificial layer and part of the first electrode layer 181 located on the side wall of the second sub-pillars 1252 are removed to expose the second sub-pillars 1252 and the sidewall of the second supporting layer 142. The protective layer 21 is removed to expose the remaining first electrode layer 181. Dielectric layers 182 are formed on the surfaces of the second sub-pillars 1252 and the first electrode layer 181. A second electrode layer 183 is formed on the sidewall of the second supporting layer 142 and the surfaces of the dielectric layers 182, and the first electrode layer 181, the dielectric layer 182 and the second electrode layer 183 form the capacitor structure 18.

In the embodiments of the disclosure, the protective layer 21 is removed by a wet etching technology (for example, etching by using a strong acid such as concentrated sulfuric acid, hydrofluoric acid, or concentrated nitric acid) or a dry etching technology.

In the embodiments of the disclosure, the dielectric layers 182 and the second electrode layer 183 may be formed by any one of the following deposition processes: a selective atomic layer deposition process, a CVD process, a PVD process, and a spin coating process. The material of the second electrode layer 183 may include metal or metal nitride, such as ruthenium (RU) or titanium nitride. The material of the dielectric layer 182 may include a high-K dielectric material, for example, one of lanthanum oxide ($La_2O_3$), aluminum oxide ($Al_2O_3$), hafnium oxide ($HfO_2$), hafnium oxynitride (HfON), hafnium silicate (HfSiOx) or zirconium oxide ($ZrO_2$), or any combination thereof. In other embodiments, the material of the first electrode layers and the second electrode layer may also be polysilicon.

In the embodiments of the disclosure, the capacitor structures 18 extend in the Y-axis direction. That is to say, each capacitor structure 18 is parallel to the semiconductor structure. The capacitor structures 18 are horizontal. On one hand, compared with vertical capacitor structures 18 with a high aspect ratio (that is, the ratio of height to width or diameter), the horizontal capacitor structures 18 can reduce the risk of tipping or breaking, so that the stability of the capacitor structures 18 can be improved. On the other hand, the stacked structure formed by stacking a plurality of capacitor structures in a vertical direction can form a three-dimensional semiconductor structure, so that the integration degree of the semiconductor structure can be improved, and miniaturization can be realized.

In some embodiments, as shown in FIG. 3O and FIG. 3P, the method for forming the semiconductor structure further includes an operation that a conductive layer 184 is formed on a surface of the second electrode layer 183, and the conductive layer 184 fills between adjacent third sub-pillars 1253.

In the embodiments of the disclosure, the material of the conductive material 184 may be polysilicon, or may also be any other suitable conductive material, such as doped polysilicon.

In some embodiments, as shown in FIG. 3Q, after the formation of the T-shaped gate structures 16, the method for forming the semiconductor structure further includes an operation that word line stairs 19 stacked in sequence in the Z-axis direction are formed, in which each layer of the word lines 191 in the word line stairs 19 are electrically connected to the corresponding plurality of the T-shaped gate structures 16 arranged in the X-axis direction.

In some embodiments, the word line stairs 19 may be formed by the following operations. Firstly, a photoresist layer with a first opening is formed on the surface of the first area A, the first opening exposes one end of the first region A, and part of the first area A is etched through the photoresist layer with the first opening to form a first stair structure. Secondly, a photoresist layer with a second opening is formed on the surface of the first stair structure, the second opening exposes part of the first stair structure, and the first stair structure is etched through the photoresist layer with the second opening to form a second stair structure. Herein the dimension of the second opening in the first direction is larger than the dimension of the first opening. Thirdly, a photoresist layer with a third opening is formed on the surface of the second stair structure, the third opening exposes part of the second stair structure, and the second stair structure is etched through the photoresist layer of the third opening to form a third stair structure. Herein the dimension of the third opening in the first direction is larger than the dimension of the second opening. The abovementioned operations are repeated, and the word line stairs 19 are finally formed after the multiple etching processes. The word line stairs 19 have gradually decreased lengths from bottom to top in the Z-axis direction.

In other embodiments, the word line stairs 19 may also be formed by the following operations. Firstly, a first word line with the first length is formed on the surface of the substrate in the first area A. Herein the first word line is electrically connected to the T-shaped gate structures 16 in the X-axis direction at the bottommost layer. Secondly, a first isolating unit with a second length is formed on a surface of the first word line, a second word line with the second length is formed on a surface of the first isolating unit, and the second word line is electrically connected to the T-shaped gate structures 16 in the first direction at the second layer from the bottom. Herein the first length is greater than the second length, and the first isolating unit is configured to isolate the adjacent first word line and second word line. Thirdly, a second isolating unit with a third length is formed on a surface of the second word line, and a third word line with the third length is formed on a surface of the second isolating unit. Herein the third word line is electrically connected to the T-shaped gate structures 16 in the X-axis direction at the third layer from bottom to top. Herein the second length is greater than the third length, and the second isolating unit is configured to isolate the adjacent second word line and third word line. The above mentioned operation is repeated, and a plurality of word lines are thus formed to form the word line stairs 19 through multiple forming processes.

In the embodiments of the disclosure, the T-shaped gate structures are formed, and the side-connecting method of the word lines is adopted, which not only solves the problem that it is difficult for a multi-layer stack to interconnect the word lines on the same plane, and the word line coupling effect can also be reduced by controlling the dimensions of a side-connected word lines.

Figure 4A:
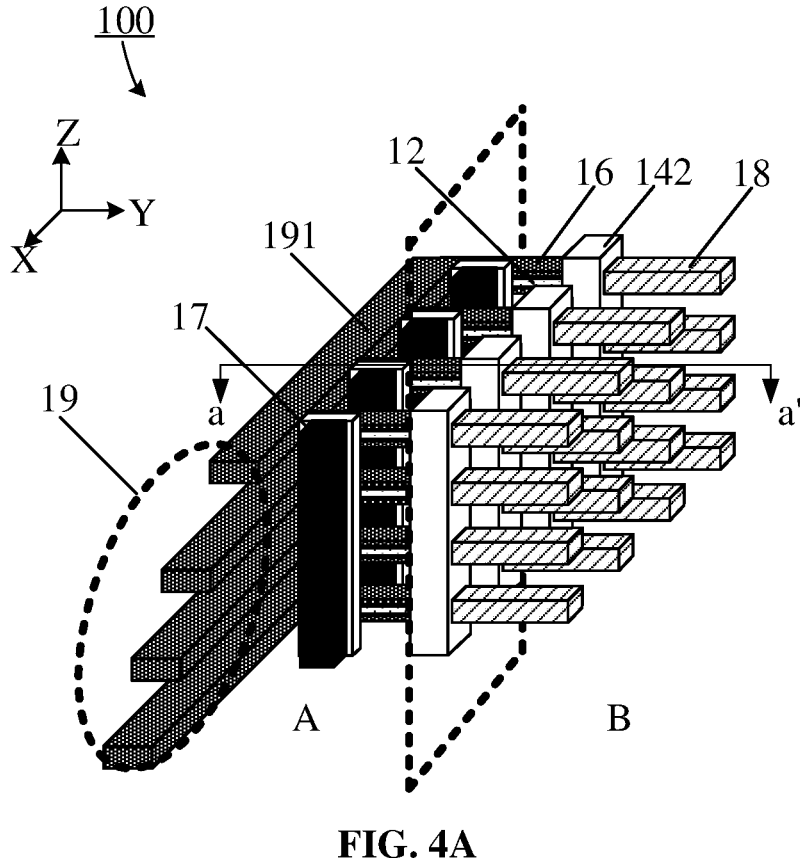
FIG. 4A illustrates a first schematic structural diagram of the semiconductor structure provided by an embodiment of the disclosure.
Figure 4B:
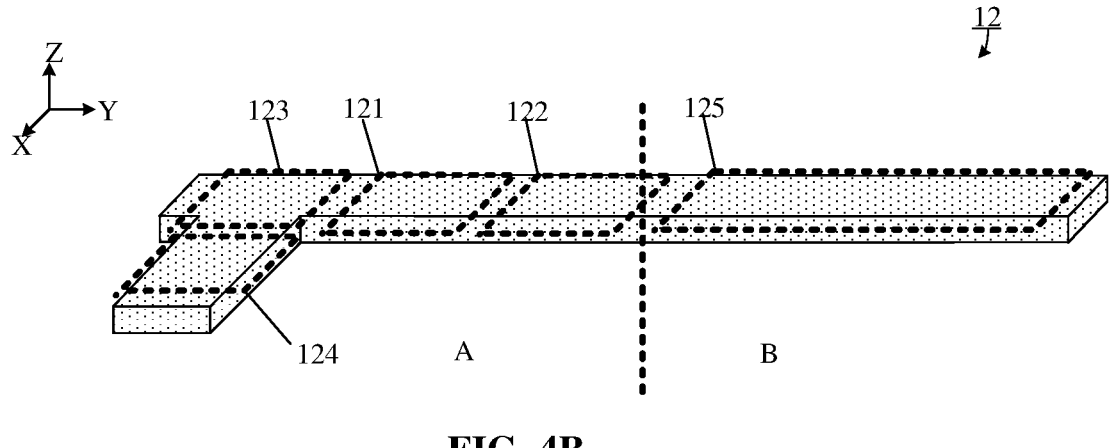
FIG. 4B illustrates a second schematic structural diagram of the semiconductor structure provided by an embodiment of the disclosure.
Figure 4C:
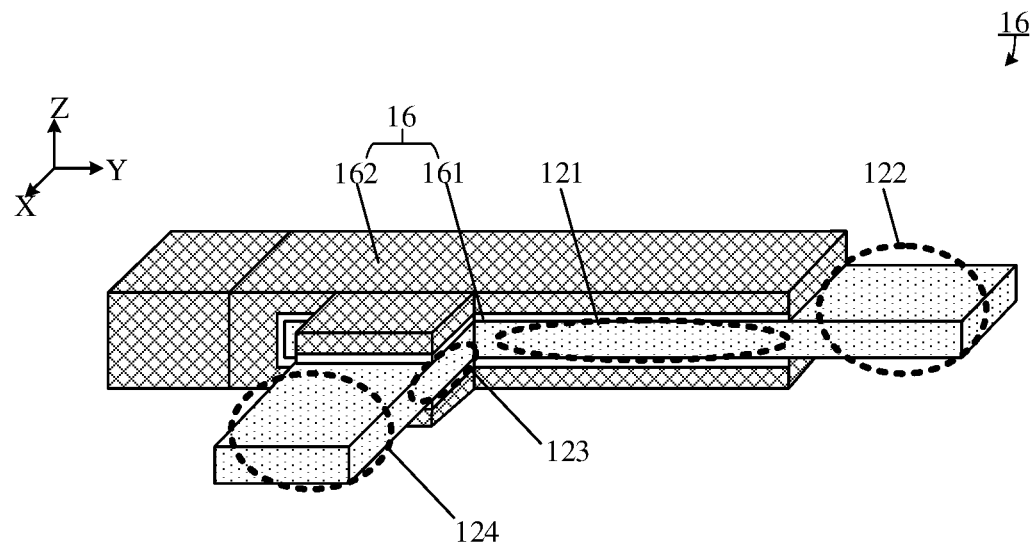
FIG. 4C illustrates a third schematic structural diagram of the semiconductor structure provided by an embodiment of the disclosure.
Figure 4D:
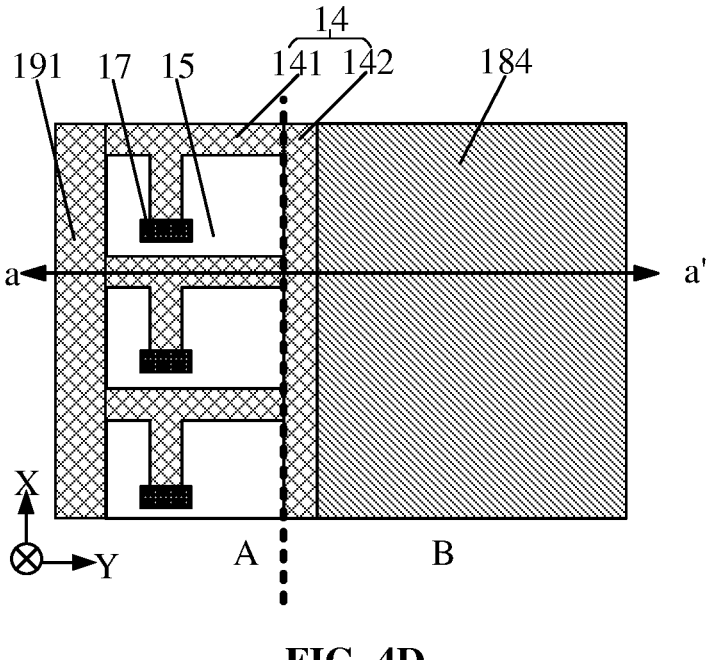
FIG. 4D illustrates a fourth schematic structural diagram of the semiconductor structure provided by an embodiment of the disclosure.
Figure 4E:
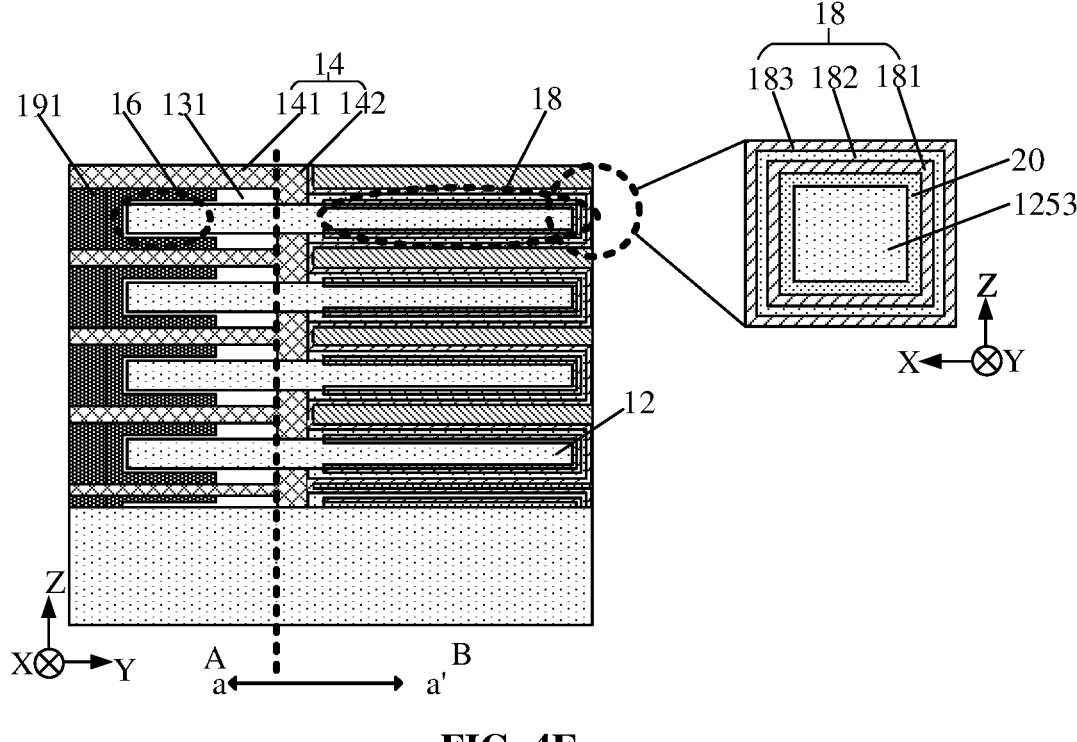
FIG. 4E illustrates a fifth schematic structural diagram of the semiconductor structure provided by an embodiment of the disclosure.

The embodiments of the disclosure further provide a semiconductor structure. The semiconductor structure is formed by the method for forming a semiconductor structure provided by the above mentioned embodiments. FIG. 4A to FIG. 4E are schematic structural diagrams of a semiconductor structure provided by an embodiment of the disclosure. FIG. 4A is a three-dimensional view of the semiconductor structure. FIG. 4B is a three-dimensional view of a T-shaped active pillar. FIG. 4C is a three-dimensional view of the T-shaped gate structure. FIG. 4D is a top view of FIG. 4A. FIG. 4E is a sectional view of FIG. 4A along a-a'.

As shown in FIG. 4A, the semiconductor structure 100 at least includes: a semiconductor substrate 10 and T-shaped active pillars 12 located on the surface of the semiconductor substrate 10, in which the T-shaped active pillars 12 are arranged in an array in the X-axis direction and the Z-axis direction; T-shaped gate structures located on surfaces of part of each T-shaped active pillar 12, in which a plurality of T-shaped gate structures 16 in the X-axis direction are interconnected; bit line structures 17 extending in the Z-axis direction; and capacitor structures 18 extending in the Y-axis direction, in which both the bit line structures 17 and the capacitor structures are connected to the T-shaped gate structures 16.

In some embodiments, as shown in FIG. 4B, the semiconductor structure 100 further includes: a first area A and a second area B arranged in the Y-axis direction in sequence. Each T-shaped active pillar 12 includes a first active pillar 121 and a second active pillar 122 located in the first area A and extend in the Y-axis direction, and a third active pillar 123 and a fourth active pillar 124 located in the first area A and extend in the X-axis direction. The first active pillar 121 is connected to the third active pillar 123. The bit line structure 17 is formed on part of the fourth active pillar 124.

In some embodiments, as shown in FIG. 4C, one T-shaped gate structure 16 includes a gate dielectric layer 161 located on the surfaces of the first active pillar 121 and the third active pillar 123, and a gate conductive layer 162 located on a surface of the gate dielectric layer 161.

In the embodiments of the disclosure, projections of the first active pillar 121 and the third active pillar 123 on the surface of the semiconductor substrate 10 are T-shaped.

In some embodiments, continuing to refer to FIG. 4B, the T-shaped active pillar 12 further includes a fifth active pillar 125 located in the second area B. The capacitor structure 18 is located on part of the fifth active pillar 125.

As shown in FIG. 4E, the capacitor structure 18 includes a first electrode layer 181, a dielectric layer 182, and a second electrode layer 183 located on the fifth active pillar 125.

In some embodiments, continuing to refer to FIG. 4D and FIG. 4E, the semiconductor structure 100 further includes: a conductive layer 184 located between the second electrode layer 183 and on the surfaces of the second electrode layer 183, and a third semiconductor layer 20 located between the first electrode layer 181 and the fifth active pillar 125.

In some embodiments, the third semiconductor layer 20 may be a metal silicide layer. The third semiconductor layer 20 is arranged to reduce the contact resistance between the capacitor structure 18 and the fifth active pillar 125.

In some embodiments, continuing to refer to FIG. 4D, there is a concave groove 15 between two adjacent ones of the T-shaped active pillars in the X-axis direction.

In some embodiments, continuing to refer to FIG. 4A, FIG. 4D, and FIG. 4E, the semiconductor structure 100 further includes: a supporting structure 14. The supporting structure 14 includes a first supporting layer 141 and a second supporting layer. The first supporting layer 141 is located on a surface of part of the second active pillar 122 located between the bit line structure 17 and the T-shaped gate structure 16. The second supporting layer 142 is located on a surface of part of the fifth active pillar 125 located between the capacitor structure and the T-shaped gate structure 16.

In some embodiments, referring to FIG. 4A, the semiconductor structure 100 further includes: word line stairs 19. The word line stairs 19 are sequentially stacked along the Z-axis direction, and each layer of word lines 191 in the word line stairs 19 is electrically connected to the corresponding plurality of T-shaped gate structures 16 arranged along the X-axis direction.

The semiconductor structure provided by the embodiments of the disclosure is similar to the semiconductor structure formed with the method provided by the above mentioned embodiments. The technical features not disclosed in detail in the embodiment of the disclosure can be referred to the above mentioned embodiments for understanding, and will not be elaborated herein.

The semiconductor structure provided by the embodiments of the disclosure has the T-shaped gate structures, and the word lines led out through the outer side of the T-shaped gate structures, so that not only the interconnection of the word lines in the same plane of a multi-layer stacked structure can be realized, but also the dimensions of the word lines can be controlled, thereby reducing a coupling effect between word line stairs.

FIG. 5A to FIG. 5D illustrate schematic diagrams of plane structures of semiconductor structures provided by embodiments of the disclosure. As shown in FIG. 5A to FIG. 5D, a semiconductor structure 100 includes: T-shaped gate structures 16, bit line structures 17, and capacitor structures 18 arranged in an array in the X-axis direction and the Z-axis direction. The bit line structures 17 and the capacitor structures 18 are connected to the T-shaped gate structures 16.

In the embodiments of the disclosure, one T-shaped gate structure 16 and one capacitor structure 18 constitute a memory cell. Adjacent memory cells in the X-axis direction have the same layout (as shown in FIG. 5A, FIG. 5C and FIG. 5D), or adjacent memory cells in the X-axis direction are axisymmetric (as shown in FIG. 5b).

In some embodiments, continuing to refer to FIG. 5A to FIG. 5D, the semiconductor structure 100 further includes word line stairs 19 extending in the X-axis direction. Each layer of word lines in the word line stairs are connected to a plurality of corresponding T-shaped gate structures 16 arranged in the X-axis direction.

Figure 5A:
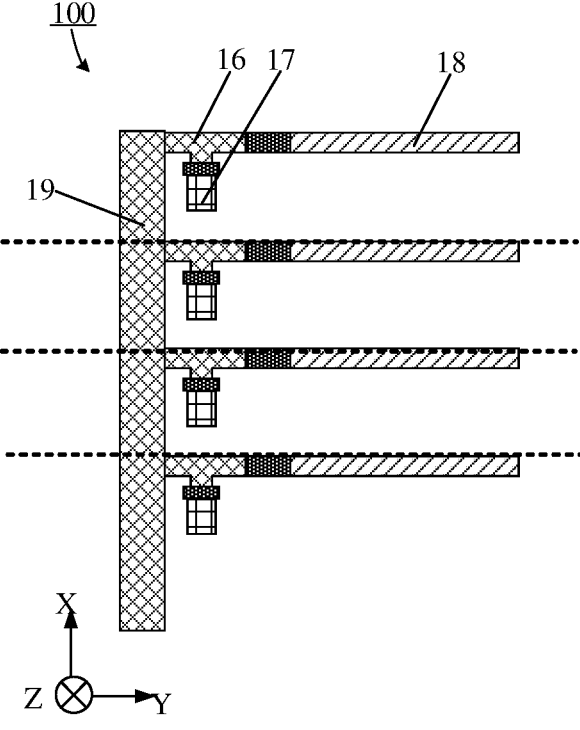
FIG. 5A illustrates a first schematic diagram of top views of semiconductor structures provided by embodiments of the disclosure.
Figure 5B:
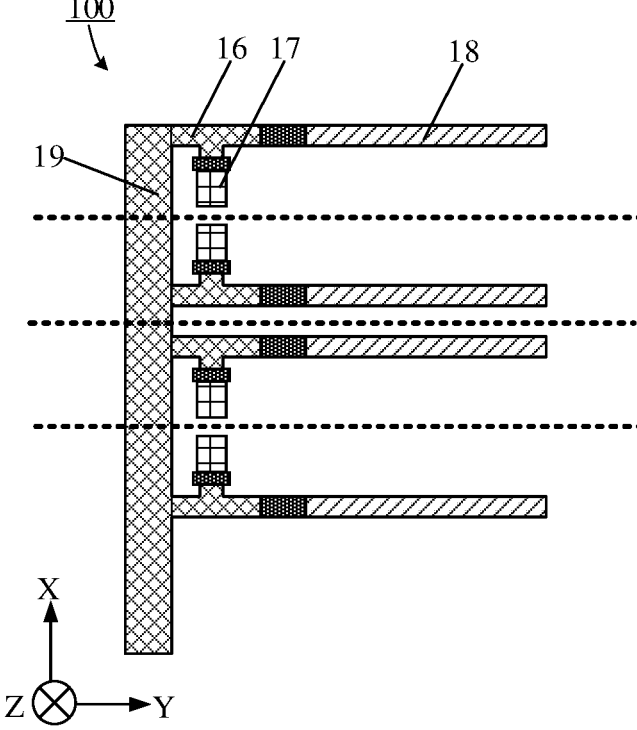
FIG. 5B illustrates a second schematic diagram of top views of semiconductor structures provided by embodiments of the disclosure.
Figure 5C:
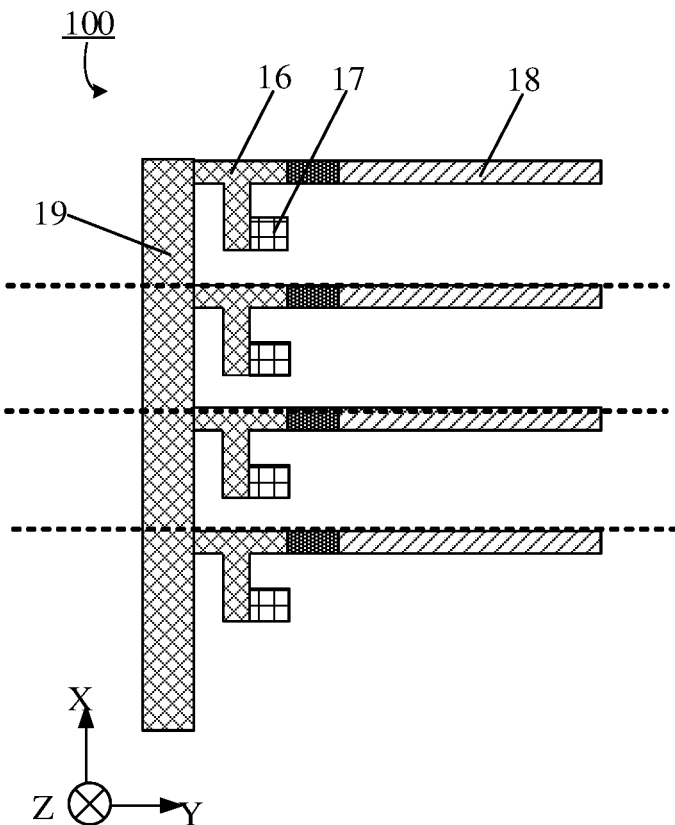
FIG. 5C illustrates a third schematic diagram of top views of semiconductor structures provided by embodiments of the disclosure.
Figure 5D:
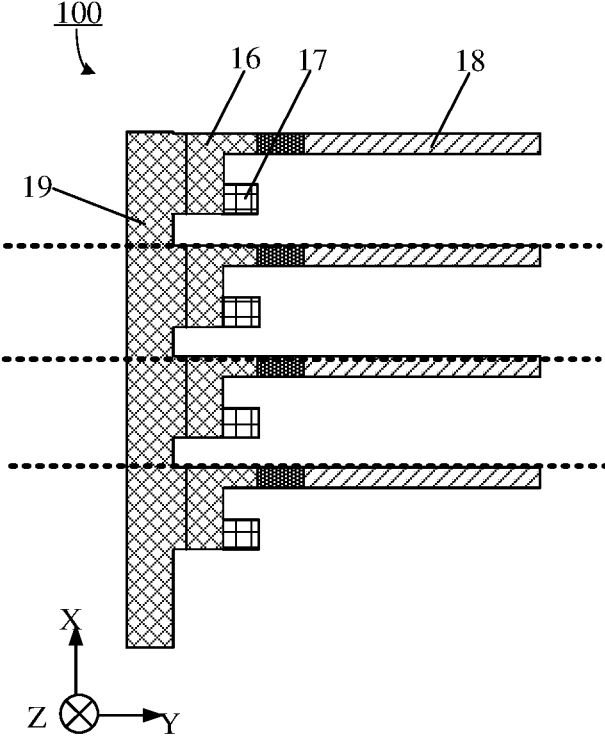
FIG. 5D illustrates a fourth schematic diagram of top views of semiconductor structures provided by embodiments of the disclosure.

In the embodiments of the disclosure, each layer of word lines in the word line stairs 19 may be rectangular (as shown in FIG. 5A to FIG. 5C), or may also be serrated (as shown in FIG. 5D).

The embodiments of the disclosure further provide a layout structure. FIG. 6D and FIG. 6B are plane layouts of layout structures provided by embodiments of the disclosure. A layout structure 200 includes: the above mentioned semiconductor structures 100 arranged at intervals in the Y-axis direction.

Figure 6A:
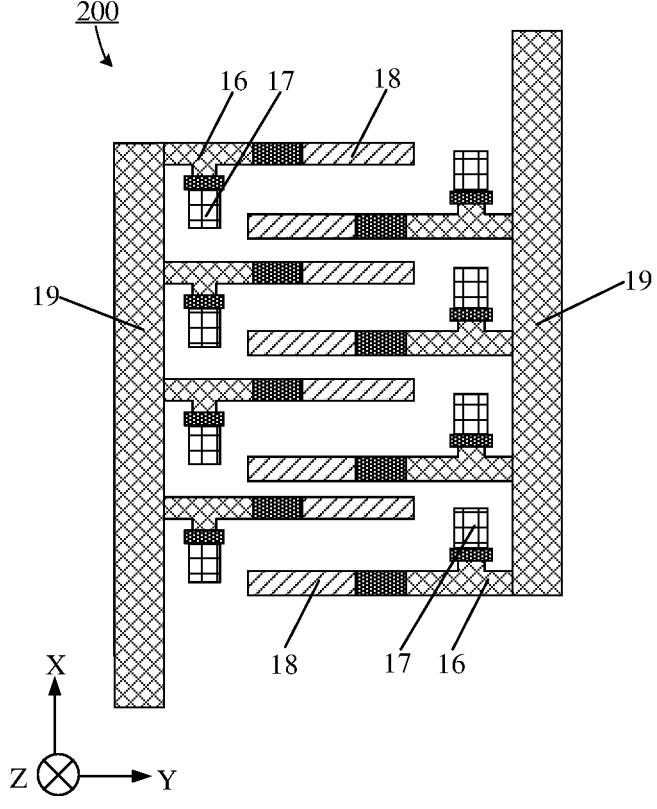
FIG. 6A illustrates a first plane layout of layout structures provided by embodiments of the disclosure.
Figure 6B:
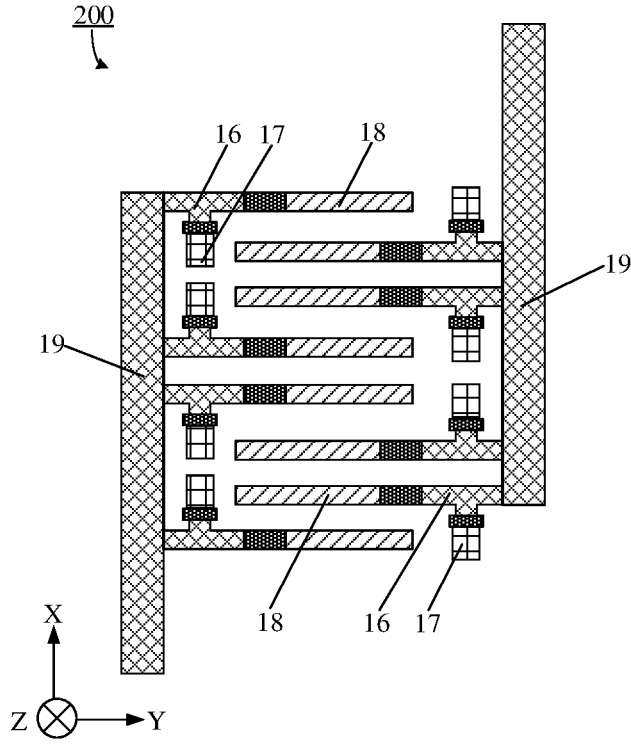
FIG. 6B illustrates a second plane layout of layout structures provided by embodiments of the disclosure.

As shown in FIG. 6A and FIG. 6B, each semiconductor structure 100 includes memory cells arranged in an array in the X-axis direction and the Z-axis direction. Each memory cell includes a T-shaped gate structure 16 and a capacitor structure 18. Two adjacent memory cells arranged along the Y-axis direction are centrosymmetric, and projection regions, along the X-axis direction, of the capacitor structures 18 of the two adjacent memory cells arranged along the Y-axis direction are at least partially overlapped.

In some embodiments, continuing to refer to FIG. 6A and FIG. 6B, the semiconductor structure 100 further includes bit line structures 17 and word line stairs 19.

In some embodiments, continuing to refer to FIG. 6A, two adjacent memory cells in the X-axis direction have the same layout.

In some embodiments, continuing to refer to FIG. 6B, two adjacent memory cells in the X-axis direction are axisymmetric.

The layout structure provided by the embodiments of the disclosure can effectively utilize the space of each semiconductor structure to realize the miniaturization of the semiconductor structure.

In several embodiments provided by the disclosure, it is to be understood that the disclosed device and method may be implemented in a non-target mode. The above described device embodiments are only schematic. For example, the division of the units is only logical function division. In actual implementation, there may be other division modes, for example, a plurality of units or components may be combined, or may be integrated into another system, or some features may be ignored or not implemented.

The characteristics disclosed in several method or device embodiments provided in the disclosure may be freely combined without conflicts to obtain new method embodiments or device embodiments.

The abovementioned descriptions are only some implementation modes of the disclosure, but the scope of protection of the disclosure is not limited thereto. Any variation or replacement readily figured out by a person skilled in the art within the technical scope disclosed in the disclosure shall fall within the scope of the protection of the disclosure. Therefore, the scope of the protection of the disclosure shall be subject to the scope of protection of the claims.

According to the semiconductor structure, the method for forming the same and the layout structure provided by the embodiments of the disclosure, the T-shaped gate structures are formed, and the word lines are formed on an outer side of the T-shaped gate structures subsequently, such that not only the interconnection of the word lines in the same plane of a multi-layer stacked structure can be realized, but also the dimensions of the word lines can be controlled, thereby reducing a coupling effect between the word line stairs.

What is claimed is:

1. A method for forming a semiconductor structure, comprising:

providing a substrate, wherein the substrate comprises a first area and a second area arranged in sequence in a second direction, and T-shaped active pillars located in the first area and the second area and arranged in an array in a first direction and a third direction, the first direction, the second direction and the third direction are perpendicular to one another, and the first direction and the second direction are parallel to a surface of the substrate, wherein each of the T-shaped active pillars comprises a first active pillar and a second active pillar located in the first area and extending in the second direction, and a third active pillar and a fourth active pillar located in the second area and extending in the first direction, and a fifth active pillar located in the second area, and the first active pillar is connected to the third active pillar, and a projection of the first active pillar and the second active pillar jointly on the surface of the semiconductor substrate is a T shape;

forming T-shaped gate structures located on surfaces of the T-shaped active pillars and bit line structures extending in the third direction on part of the fourth active pillars in the first area, wherein a plurality of the T-shaped gate structures located in the first direction are interconnected; and forming capacitor structures extending in the second direction on the fifth active pillars in the second area, wherein the bit line structures and the capacitor structures are connected to the T-shaped gate structures.

2. The method of claim 1, wherein
wherein forming the T-shaped gate structures located on the surfaces of the T-shaped active pillars and the bit line structures on part of the fourth active pillars in the first area comprises:

forming each of the T-shaped gate structures on the surfaces of the first active pillar and the third active pillar; and forming each of the bit line structures extending in the third direction at one end, which is far away from the third active pillar, of the fourth active pillar.

3. The method of claim 2, wherein
the T-shaped active pillars are formed by:
providing a semiconductor substrate;

forming a stacked structure located in the first area and the second area on the surface of the semiconductor structure, the stacked structure comprising first semiconductor layers and second semiconductor layers stacked alternately in the third direction;

removing the first semiconductor layers in the first area to expose the second semiconductor layers in the first area;

performing thinning processing on the exposed second semiconductor layers to form initial active layers; and processing the initial active layers to form the T-shaped active pillars.

4. The method of claim 3, wherein
processing the initial active layers to form the T-shaped active pillars comprises:

forming a first sacrificial layer and a first supporting layer on a surface of each of the initial active layers in sequence, wherein the first supporting layer fills between two adjacent ones of the first sacrificial layers;

removing part of the first supporting layer, part of the first sacrificial layer and part of the initial active layer in the first area, and part of the stacked structure in the second area, so as to form a plurality of concave grooves arranged at intervals in the first direction; and removing part of the initial active layer in the second direction to form a first space, wherein the remaining initial active layer forms the T-shaped active pillar.

5. The method of claim 4, further comprising:
filling an isolating material in the concave grooves to form an isolating layer after forming the concave grooves.

6. The method of claim 5, wherein
the first active pillar, the second active pillar, the third active pillar and the fourth active pillar are formed by:

removing part of the first sacrificial layer in the first direction and the second direction to expose part of the initial active layer and form a second space, wherein parts, extending in the first direction and in the second direction, of the exposed part of the initial active layer respectively form the first active pillar and the third active pillar; parts, extending in the first direction and in the second direction, of the un-exposed part of the initial active layer respectively form the second active pillar and the fourth active pillar; and the second space contains the first space.

7. The method of claim 6, wherein
forming each of the T-shaped gate structures on the surfaces of the first active pillar and the third active pillar comprises:

forming a gate dielectric layer and a gate conductive layer on the surfaces of the first active pillar and the third active pillar in sequence to form the T-shaped gate structure, wherein the gate conductive layer fills the second space.

8. The method of claim 6, wherein
forming each of the bit line structures extending in the third direction at one end, which is far away from the third active pillar, of the fourth active pillar comprises:

removing part of the first sacrificial layer and part of the isolating layer on the sidewall of the fourth active pillar to form a bit line groove, wherein the bit line groove exposes one end, which is far away from the third active pillar, of the fourth active pillar, and part of the isolating layer remains between two adjacent ones of the T-shaped active pillars in the first direction; and filling a bit line metal material in the bit line groove to form the bit line structure.

9. The method of claim 4, wherein the fifth active pillars extends in the second direction; the fifth active pillars are formed by:

removing the first semiconductor layers in the remaining stacked structures in the second area and the isolating layer located in the second area to expose the second semiconductor layers; and performing thinning processing on the exposed second semiconductor layers to form the fifth active pillars, wherein each of the fifth active pillars is connected to corresponding one of the second active pillars.

10. The method of claim 9, wherein each of the fifth active pillars comprises a first sub-pillar, a second sub-pillar and a third sub-pillar arranged in the second direction in sequence; and wherein forming the capacitor structures in the second area comprises:

forming a second supporting layer on a surface of each first sub-pillar, wherein the second supporting layer fills between two adjacent ones of the first sub-pillars, and the first supporting layer and the second supporting layer constitute a supporting structure of the semiconductor structure;

forming a second sacrificial layer on a surface of each second sub-pillar, wherein the second sacrificial layer fills between two adjacent ones of the second sub-pillars;

forming a third semiconductor layer on a surface of each third sub-pillar;

forming a first electrode layer on a surface of the third semiconductor layer and a sidewall of the second sacrificial layer;

forming a protective layer on surface of the first electrode layer and in a gap formed between surfaces of the first electrode layer;

removing the second sacrificial layer and the first electrode layer located on the sidewall of the second sub-pillar to expose the second sub-pillar and the sidewall of the second supporting layer;

removing the protective layer to expose the remaining first electrode layer;

forming a dielectric layer on the surfaces of the second sub-pillar and the first electrode layer; and forming a second electrode layer on the sidewall of the second supporting layer and a surface of the dielectric layer, wherein the first electrode layer, the dielectric layer, and the second electrode layer constitute the capacitor structure.

11. The method of claim 10, further comprising:

forming a conductive layer on a surface of the second electrode layer, wherein the conductive layer fills between adjacent third sub-pillars.

12. The method of claim 11, further comprising:

forming word line stairs stacked in sequence in the third direction after forming the T-shaped gate structures, wherein each layer of word lines of the word line stairs are electrically connected to the corresponding T-shaped gate structures arranged in the first direction.

13. A semiconductor structure, at least comprising:

a semiconductor substrate comprising a first area and a second area arranged in a second direction;

a T-shaped active pillar located on a surface of the semiconductor substrate, a plurality of T-shaped active pillars being arranged in an array in a first direction and a third direction, wherein each of the T-shaped active pillars comprises a first active pillar and a second active pillar located in the first area and extending in the second direction, and a third active pillar and a fourth active pillar located in the second area and extending in the first direction, and a fifth active pillar located in the second area, and the first active pillar is connected to the third active pillar, and a projection of the first active pillar and the second active pillar jointly on the surface of the semiconductor substrate is a T shape;

a T-shaped gate structure and a bit line structure located on a surface of part of each of the T-shaped active pillars, wherein a plurality of T-shaped gate structures located in the first direction are interconnected, and the bit line structure formed on part of the fourth active pillar and extends in the third direction; and a capacitor structure formed on the fifth active pillar; wherein a plurality of capacitor structures extending in the second direction, each of the bit line structures and each of the capacitor structures being connected to one corresponding T-shaped gate structure, the first direction, the second direction and the third direction being perpendicular to one another, and the first direction and the second direction being parallel to the surface of the semiconductor substrate.

14. The semiconductor structure of claim 13, wherein there is a concave groove between two adjacent ones of the T-shaped active pillars in the first direction.

15. The semiconductor structure of claim 13, further comprising:

a supporting structure;

the first supporting structure comprises a first supporting layer and a second supporting layer, wherein the first supporting layer is located on a surface of part of each second active pillar between the bit line structure and the T-shaped gate structure; and the second supporting layer is located on a surface of part of each fifth active pillar between the capacitor structure and the T-shaped gate structure.

16. The semiconductor structure of claim 13, further comprising word line stairs, wherein the word line stairs are stacked in sequence in the third direction; and each layer of word lines of the word line stairs are connected to a plurality of T-shaped gate structures arranged in the first direction.

17. A layout structure, comprising the semiconductor structures of claim 13 arranged at intervals in the second direction, wherein each of the semiconductor structures comprises memory cells arranged in an array in the first direction and the third direction; each of the memory cells comprises T-shaped gate structures and capacitor structures, wherein two adjacent ones of the memory cells in the second direction are centrosymmetric, and projection regions of the capacitor structures of the two adjacent memory cells in the second direction are at least partially overlapped in the first direction, wherein two adjacent ones of the memory cells in the first direction are the same or are axisymmetric.

18. A semiconductor structure, at least comprising:

a T-shaped active pillar;

a T-shaped gate structure arranged on a surface of part of the T-shaped active pillar;

a bit line structure arranged at one end of the T-shaped active pillar in a first direction, and a capacitor structure arranged at one end of the T-shaped active pillar in a second direction, wherein the bit line structure extends in a third direction; and the first direction, the second direction and the third direction are perpendicular to one another, wherein the T-shaped active pillar comprises a channel region with T-shaped, a source region and a drain region, wherein the source region is arranged at one end of the channel region in the first direction and the drain region is arranged at one of the channel region in the second direction, and the T-shaped gate structure is arranged on a surface of the channel region;

the bit line structure is electrically connected with the source region; and a capacitor structure is electrically connected with the drain region.

19. The semiconductor structure of claim 18, further comprising word line stairs arranged at the other end of the T-shaped active pillar in the second direction, wherein the word line stairs are stacked in sequence in the third direction; and each of word lines of the word line stairs are connected to a plurality of T-shaped gate structures arranged in the first direction.

\* \* \* \* \*